United States Patent
King

(10) Patent No.: US 11,146,208 B2
(45) Date of Patent: Oct. 12, 2021

(54) SOLAR GENERATOR

(71) Applicant: Electronic Controlled Systems, Inc., Bloomington, MN (US)

(72) Inventor: Lael King, New Prague, MN (US)

(73) Assignee: Electronic Controlled Systems, Inc., Bloomington, MN (US)

( * ) Notice: Subject to any disclaimer, the term of this patent is extended or adjusted under 35 U.S.C. 154(b) by 0 days.

(21) Appl. No.: 16/565,377

(22) Filed: Sep. 9, 2019

(65) Prior Publication Data

US 2020/0007076 A1 Jan. 2, 2020

Related U.S. Application Data

(63) Continuation-in-part of application No. 16/389,893, filed on Apr. 19, 2019.

(60) Provisional application No. 62/660,188, filed on Apr. 19, 2018, provisional application No. 62/660,191, filed on Apr. 19, 2018.

(51) Int. Cl.
*H02S 20/32* (2014.01)
*H02S 40/34* (2014.01)
*H02S 40/22* (2014.01)
*H02S 20/30* (2014.01)
*G01S 3/786* (2006.01)

(52) U.S. Cl.
CPC ............ *H02S 20/32* (2014.12); *G01S 3/7861* (2013.01); *H02S 20/30* (2014.12); *H02S 40/22* (2014.12); *H02S 40/34* (2014.12)

(58) Field of Classification Search
CPC .......... H02S 20/30; H02S 20/32; H02S 40/22; H02S 40/34
See application file for complete search history.

(56) References Cited

U.S. PATENT DOCUMENTS

| 4,203,426 A * | 5/1980 | Matlock | F24S 23/74 126/605 |
| 2003/0140960 A1* | 7/2003 | Baum | H01L 31/02021 136/244 |
| 2008/0210220 A1* | 9/2008 | Perslow | F24S 30/422 126/573 |
| 2011/0079213 A1* | 4/2011 | Lam | F24S 50/20 126/573 |
| 2014/0202521 A1* | 7/2014 | Lee | F24S 30/45 136/246 |

(Continued)

FOREIGN PATENT DOCUMENTS

RO 104383 B1 * 12/1993

OTHER PUBLICATIONS

English machine translation of RO 104383. (Year: 1993).*

*Primary Examiner* — Lindsey A Bernier
(74) *Attorney, Agent, or Firm* — Skaar Ulbrich Macari, P.A.

(57) ABSTRACT

A solar generator includes a base, a rotary plate provided to the base such that the rotary plate can rotate with respect to the base, a cover disposed atop the rotary plate, solar panel disposed atop the cover such that the solar panel is angled with respect to a horizontal plane, and a motor provided to the rotary plate such that the motor can engage the base to enable rotation of the rotary plate with respect to the base. A photosensor and a method of rotationally aligning a solar panel with the sun in an azimuth orientation are also provided.

19 Claims, 19 Drawing Sheets

(56) References Cited

U.S. PATENT DOCUMENTS

| | | | | |
|---|---|---|---|---|
| 2014/0318597 A1* | 10/2014 | Khan | ................. | F24S 50/20 |
| | | | | 136/246 |
| 2015/0338131 A1* | 11/2015 | Ziegler | ............... | H02S 20/32 |
| | | | | 126/714 |
| 2017/0170780 A1* | 6/2017 | Wildman | ............ | H02S 20/32 |

* cited by examiner

SOLAR GENERATOR

PRIORITY

This application is a continuation-in-part of U.S. patent application Ser. No. 16/389,893, filed Apr. 19, 2019, which claims the priority benefit of U.S. Provisional Application No. 62/660,188, filed on Apr. 19, 2018 and U.S. Provisional Application No. 62/660,191, filed on Apr. 19, 2018. All of the foregoing applications are hereby incorporated herein by reference in their entirety.

FIELD

The present invention relates generally to solar power systems, and more particularly, to solar energy collectors having articulating solar cells that can track the sun.

BACKGROUND

Solar panels are increasingly popular devices for charging batteries and supplying power. This is particularly the case in the recreational vehicle (RV) and camping industries.

Solar panels present at least three significant concerns: they are expensive, inefficient, and suffer degradation of their power production based on their angle to the sun. Thus, a fixed solar panel will almost never be able to achieve its ideal power rating. This means a person that desires to produce meaningful amounts of solar power from fixed solar panels is required to purchase significantly more solar capacity than that person's rated power needs would seem to suggest. For example, someone who needs 10 kWh of power in a day and gets 5 hours of sunlight might actually need 5 kW of solar cells, rather than the mathematically calculated 2 kW. Thus, the need to oversize the number of solar cells makes solar power more expensive than theoretically necessary. Coupling this deficiency with solar panels' relatively low efficiency (which means they are less power-dense), the area needed for an adequate amount of solar panels is an issue in areas where space is at a premium, such as in mobile environments like an RV that has limited area on the roof to mount solar panels.

Thus, there remains a need to increase the real power output of solar panels, solve the resulting complications that arise, decrease the area required per power produced, and provide a cost-effective solution.

SUMMARY

The present invention addresses certain deficiencies discussed above by providing a solar generator. The generator in one example includes a base, a turntable provided to the base, a solar array disposed atop the turntable and a cover or dome that is fastened atop the base to define an enclosure surrounding the solar array and turntable. The solar array includes separate solar cell or panel segments arranged side-by-side in a row. Multiple rows are provided. The rows are positioned such that each row can be constantly oriented towards the sun while minimizing shading of the other solar panel arrays in adjacent rows in order to optimize solar collection of solar radiation per unit area. A motor control unit operates motors to adjust the azimuth and elevation angle of the solar elements in the array so that the sun can be tracked as it moves across the sky. The skew or any other orientation of the solar elements can be adjusted as well.

The disclosure includes a solar generator. The solar generator in one example comprises a base, a turntable provided to the base such that the turntable can rotate with respect to the base, and a plurality of solar cell segments arranged in a plurality of rows, and at least one of the rows comprising at least two solar cell segments. The plurality of solar cell segments are disposed atop the turntable. Each of the plurality of rows of solar cell segments are mechanically linked to one another such that changing an elevational aim of the solar cell segments in one row simultaneously changes an elevational aim of the solar cell segments in each of the other rows of solar cell segments.

A dome can be disposed atop the base that together with the base defines an enclosure in which the turntable and the plurality of solar cell segments are enclosed. The dome can comprise a material that blocks transmission of solar radiation in at least a portion of the infrared spectrum and/or the ultraviolet spectrum, or the dome can include a film provided to the dome that blocks transmission of solar radiation in at least a portion of the infrared spectrum and/or the ultraviolet spectrum. One or both of the dome and the base include a vent that allows hot air inside of the enclosure to exit the enclosure.

An azimuth motor can be coupled to the turntable such that energizing the azimuth motor rotates the turntable. An elevation motor can be coupled to at least one of the solar cell segments such that energizing the elevation motor pivots an elevation angle of at least one of the solar cell segments. A motor control unit can be provided to the solar generator and coupled to each of the azimuth motor and the elevation motor, the motor control unit comprising software code stored in a memory of the motor control unit to control the operation of the azimuth motor and the elevation motor. The motor control unit can be configured to operate the azimuth motor and the elevation motor to automatically adjust an elevation angle and an azimuth angle of the plurality of solar cell segments according to a position of the sun.

At least one of the plurality of solar cell segments can include a reflector portion defining an edge portion of at least part of the solar cell segment. The reflector portion can be angled or curved with respect to a surface of a solar cell portion of the solar cell segment such that inbound solar radiation is reflected by the reflector portion onto the surface of the solar cell portion.

At least one of the plurality of solar cell segments can also include a reflective corner facet. The reflective corner facet can be angled with respect to a surface of the reflector portion and with respect to the surface of the solar cell portion such that inbound solar radiation is reflected by the reflective corner facet onto the surface of the solar cell portion.

Each of the plurality of rows can be disposed at a different vertical height with respect to the turntable such that pivoting motion of each of the rows minimizes the potential for shading of one of the rows by another of the rows.

Each of the plurality of rows can be mechanically linked to one another with a linkage member that is pivotally linked to at least one of the solar cell segments in each of the plurality of rows.

A solar cell surface of each of the solar cell segments can be planar or curved.

The solar generator can further include a battery, solar controller and/or inverter disposed in the solar generator. The motor control unit can be coupled to the battery and to the electric motors. A portion of the electrical power generated by the plurality of solar cell segments can be directed to the battery when needed to recharge the battery.

The disclosure also includes a solar generator, comprising a base, a dome disposed atop the base that together with the base defines an enclosure, a turntable disposed entirely within the enclosure, the turntable rotatable with respect to the base, a plurality of solar cell segments arranged in a plurality of rows, and at least one of the rows comprising at least two solar cell segments. The plurality of solar cell segments are disposed entirely inside of the enclosure and atop the turntable. Each of the plurality of rows of solar cell segments are mechanically linked to one another such that changing an elevational aim of the solar cell segments in one row simultaneously changes an elevational aim of the solar cell segments in each of the other rows of solar cell segments.

An azimuth motor can be coupled to the turntable such that energizing the azimuth motor rotates the turntable. An elevation motor coupled to at least one of the solar cell segments such that energizing the elevation motor pivots an elevation angle of at least one of the solar cell segments. A motor control unit can be provided to the solar generator and coupled to each of the azimuth motor and the elevation motor. The motor control unit can be configured to control the operation of the azimuth motor and the elevation motor such that the azimuth motor and the elevation motor automatically adjust an elevation angle and an azimuth angle of the plurality of solar cell segments to correspond to a position of the sun as the sun moves across the sky.

The disclosure further includes a method of tracking the sun with a solar cell array. The method can include disposing a plurality of solar cell segments atop a turntable, arranging the plurality of solar cell segments in a plurality of spaced-apart rows, pivotably mounting each of the rows atop the base such that an elevation angle of each of the rows can be pivoted, linking each of the plurality of rows together mechanically such that changing an elevation of one of the rows causes an elevation of each of the other rows to simultaneously adjust by pivoting about a respective pivot point or each row, and rotating the turntable to change an azimuth orientation of the plurality of solar segments without rotating each of the plurality of solar cell segments individually and without rotating each of the plurality of rows individually.

The plurality of solar cell segments and the turntable can be enclosed inside of a dome.

The plurality of solar cell segments can be moved in track with the sun by monitoring a first power measurement for a first solar cell segment of the plurality of solar cell segments, monitoring a second power measurement for a second solar cell segment of the plurality of solar cell segments, and rotating the turntable until the first and second power measurements differ by less than a predetermined value.

The disclosure still further includes a solar generator that includes a base, a rotary plate provided to the base such that the rotary plate can rotate with respect to the base, a cover disposed atop the rotary plate, solar panel disposed atop the cover such that the solar panel is angled with respect to a horizontal plane, and a motor provided to the rotary plate such that the motor can engage the base to enable rotation of the rotary plate with respect to the base.

The cover can define a pair of angled sidewalls rising vertically above the solar panel. The surface material on the pair of sidewalls facing the solar panel can be reflective. The angle of the inner surfaces of the pair of angled sidewalls can be 40 degrees from a vertical plane in one example, such that a solar ray coming from directly above will strike the reflective surface and be reflected onto the solar cells.

The motor can engage the base via a gear wheel secured to the motor and the gear wheel engages a track defined in the base.

The rotary plate can be rotationally secured to the base via a slip ring. The slip ring can be configured to pass electrical power though the rotary plate while allowing the rotary plate to rotate through an unlimited number of complete revolutions.

The solar panel can form an angle of twelve degrees with respect to the horizontal plane in one example.

The cover can define at least one hole through the cover that is located below the solar panel such that conduit from the solar panel can pass through the cover and such that a human can access electrical components disposed on the rotary plate.

A motor controller can be disposed on the rotary plate and a power source disposed on the rotary plate. The motor controller can be coupled to the motor and to the power source. The motor controller can be configured to automatically rotate the solar panel via actuation of the motor such that the solar panel is optimally aligned with the sun as the sun moves across the sky. The motor controller can also be configured to compare a solar radiation value from a first solar cell of the solar panel with a solar radiation value of a second solar cell of the solar panel and rotate the solar panel so that the solar radiation values of the first and second solar cells differ by less than a preset deviation amount. The motor controller can further be configured to compare a solar radiation value from a first sensor of a photosensor to a solar radiation value of a second sensor of the photosensor and rotate the solar panel so that the solar radiation values of the first and second sensors differ by less than a preset deviation amount. The motor controller can additionally be configured to automatically not rotate the solar panel when a power reading provided to the motor controller is below a preset value and to automatically begin rotating the rotary plate to optimally align the solar panel with the sun when the power reading provided to the motor controller is above the preset value.

The disclosure also includes a method of rotationally aligning a solar panel with the sun in an azimuth orientation. The solar panel is mounted atop a rotational structure. The method includes comparing a solar radiation value from a first sensor to a solar radiation value of a second sensor, if the solar radiation values of the first and second sensors differ by more than a preset deviation amount, then rotating the solar panel until the solar radiation values of the first and second sensors differ by less than the preset deviation amount, and if the solar radiation values of the first and second sensors differ by less than a preset deviation amount, then not rotating the solar panel.

The step of comparing the solar radiation value from the first sensor to the solar radiation value of the second sensor can be repeated periodically, such as every 10 minutes, 15 minutes, 30 minutes or other time period.

The first and second sensors can each be solar cells, or they can each be light sensors located in a photosensor.

The method can further include automatically not rotating the solar panel when a power reading provided to the motor controller is below a preset value, and automatically beginning rotating the rotary plate to optimally align the solar panel with the sun when the power reading provided to the motor controller is above the preset value.

The disclosure still further includes a photosensor for a solar generator. The photosensor can include a base, a T-shaped wall extending vertically from the base, a first light sensor disposed adjacent to a stem of the T-shaped wall on a first side thereof, a second light sensor disposed adjacent to the stem of the T-shaped wall on a second side thereof that is opposite the first side, and a cover disposed over the base to enclose the T-shaped wall, first light sensor and second light sensor. A third light sensor can be disposed adjacent to the head of the T-shaped wall on a side thereof that is opposite the stem.

Other features and aspects of particular embodiments will be described in the Detailed Description portion of this application.

The above summary is not intended to limit the scope of the invention, or describe each embodiment, aspect, implementation, feature or advantage of the invention. The detailed technology and preferred embodiments for the subject invention are described in the following paragraphs accompanying the appended drawings for people skilled in this field to well appreciate the features of the claimed invention. It is understood that the features mentioned hereinbefore and those to be commented on hereinafter may be used not only in the specified combinations, but also in other combinations or in isolation, without departing from the scope of the present invention.

Figure 1:
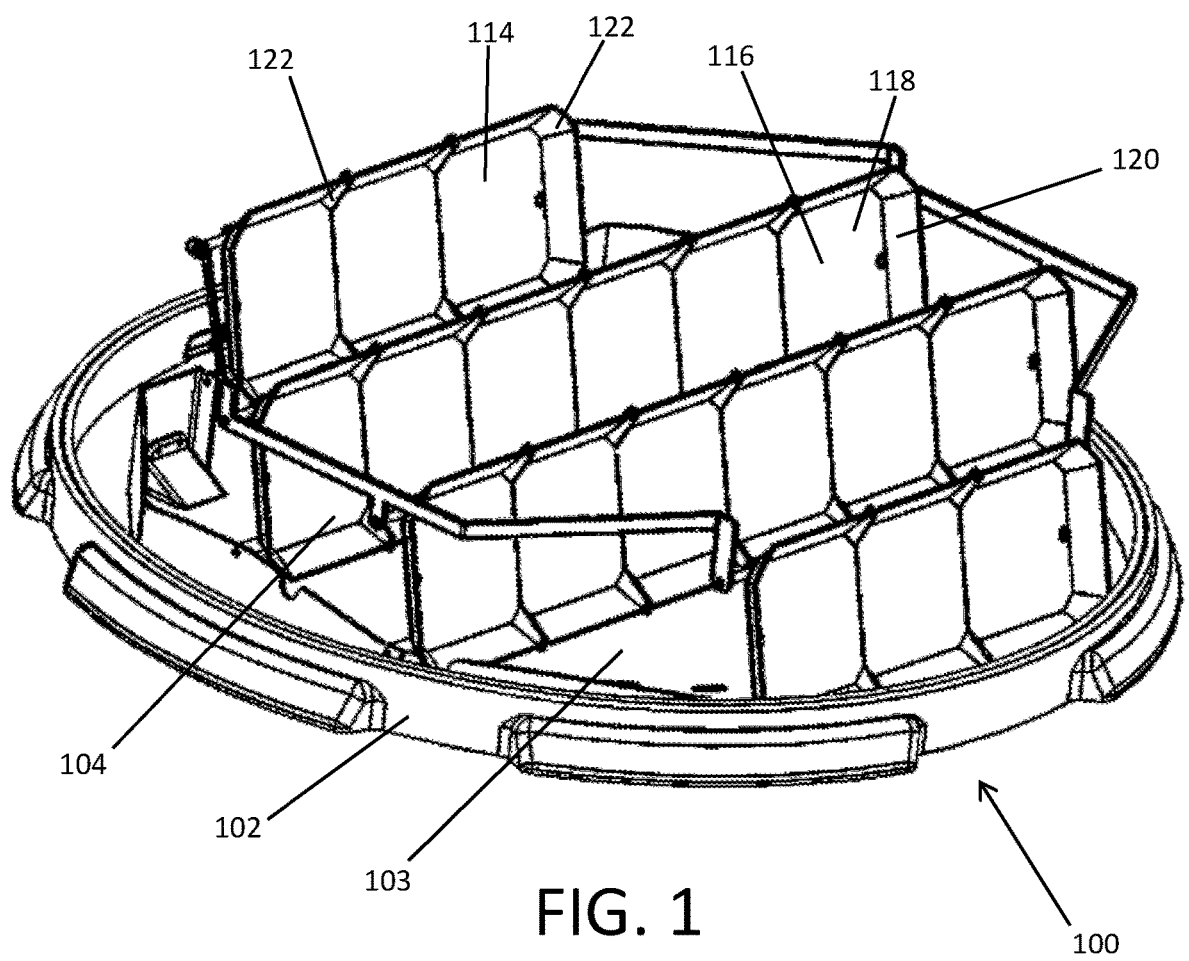
FIG. 1 is a perspective view of a solar power generator according to certain example embodiments.
Figure 2:
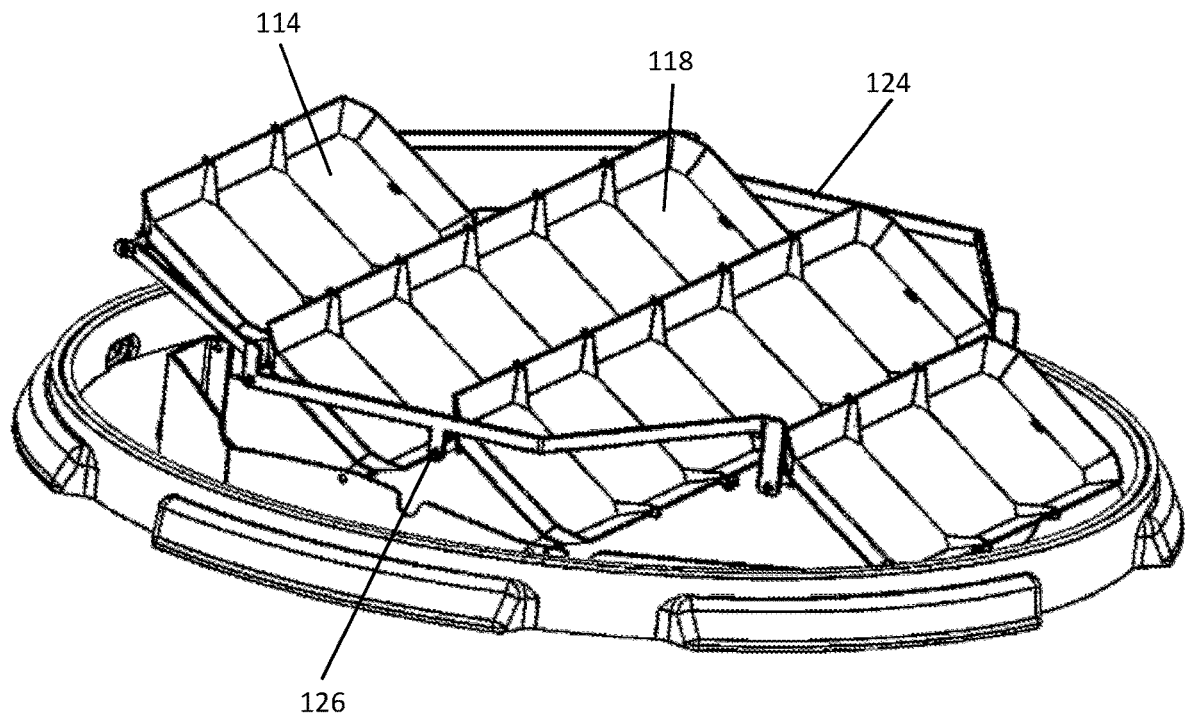
FIG. 2 is another perspective view of a solar power generator according to certain example embodiments.
Figure 3:
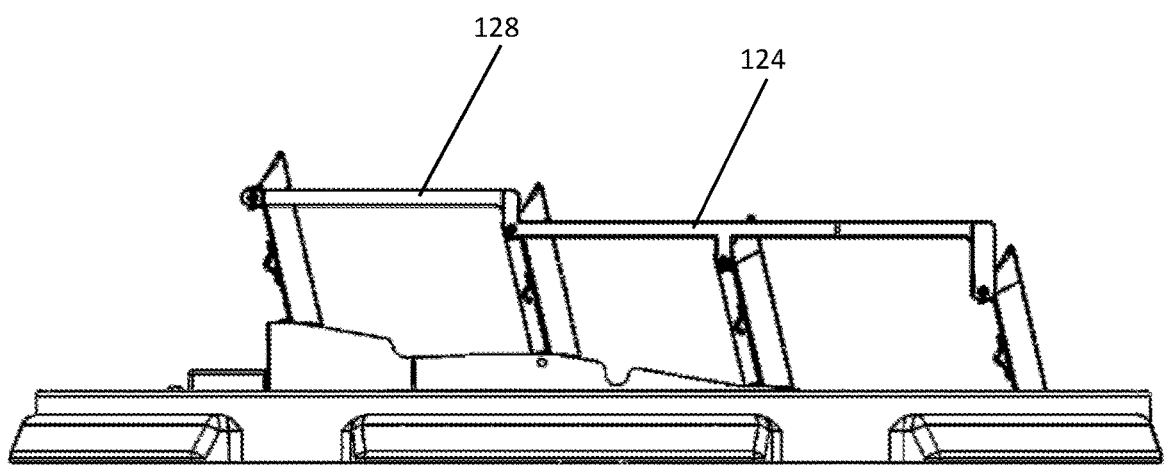
FIG. 3 is a side view of a solar power generator according to certain example embodiments.
Figure 4:
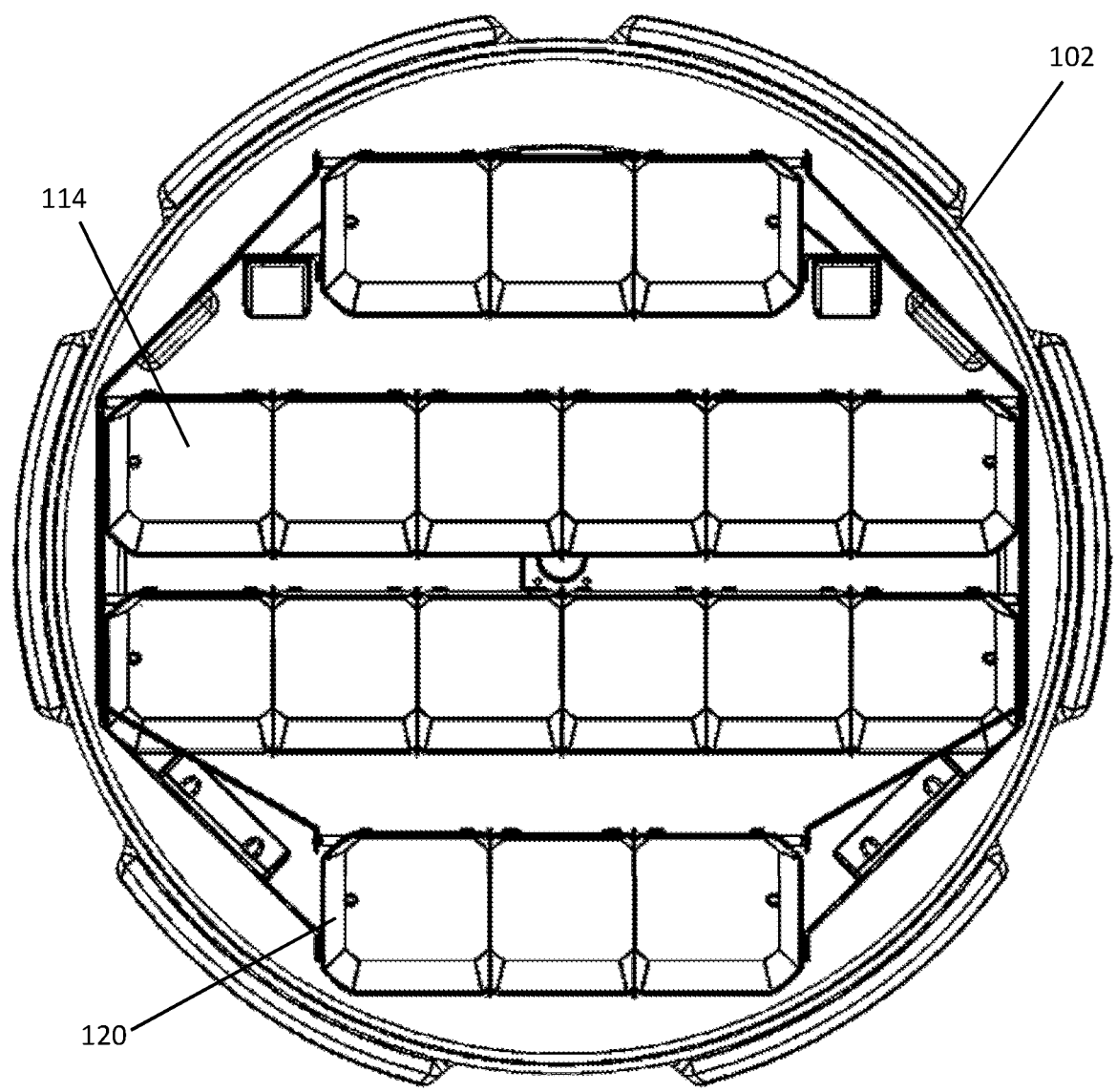
FIG. 4 is a top plane view of a solar power generator according to certain example embodiments.
Figure 5:
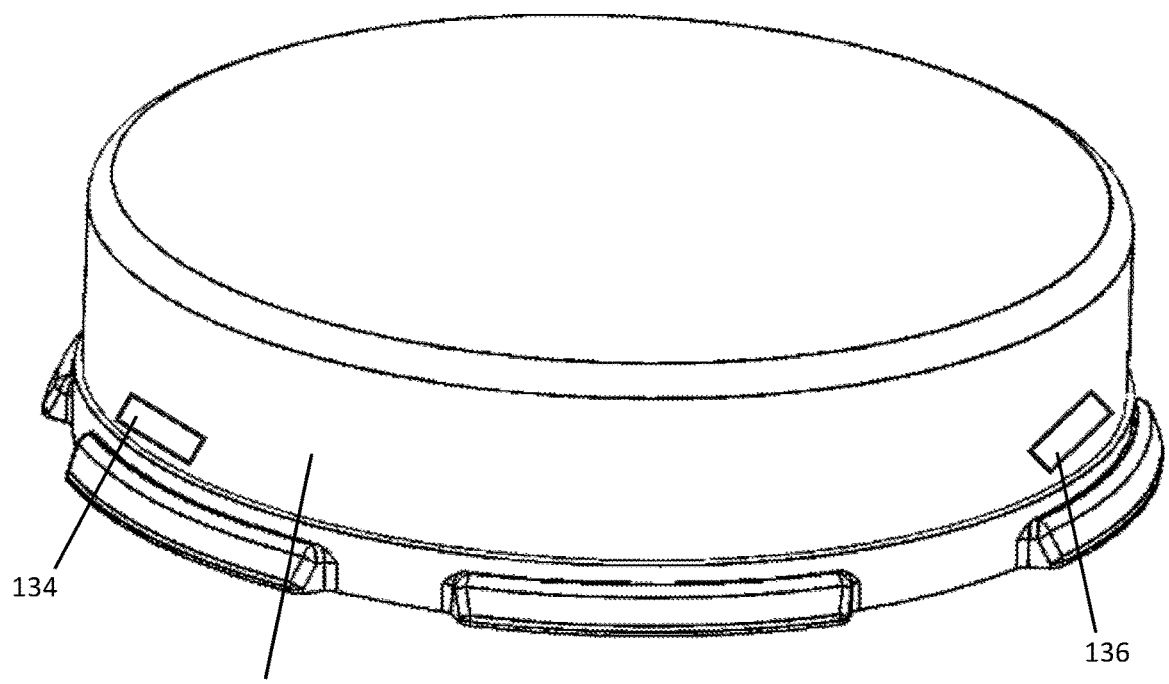
FIG. 5 is a perspective view of a solar power generator according to certain example embodiments.
Figure 6:
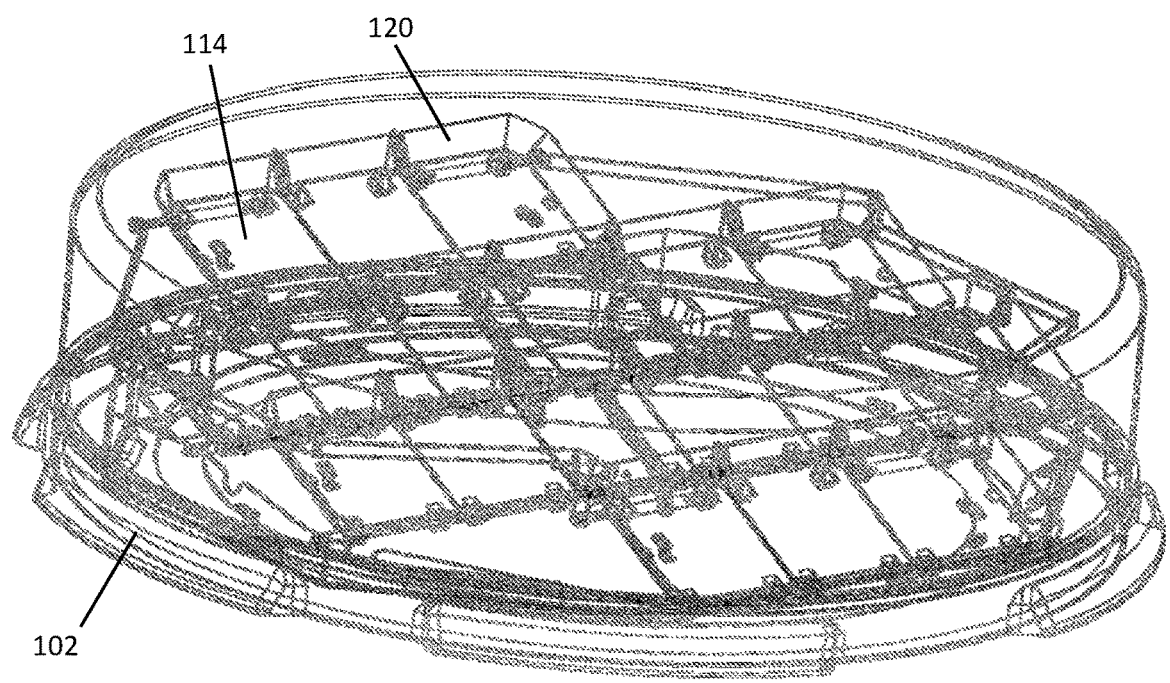
FIG. 6 is the same a perspective view as FIG. 5 but now showing structures internal to the dome.
Figure 7:
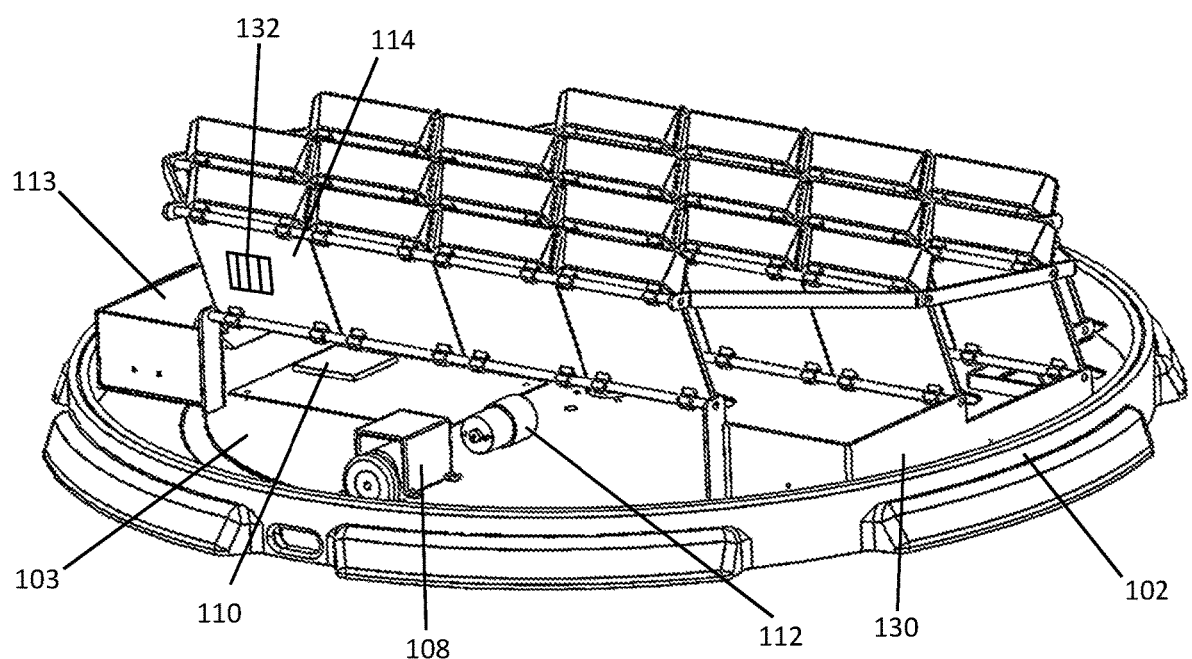
FIG. 7 is a perspective view of a solar power generator in accordance with certain example embodiments.

While the invention is amenable to various modifications and alternative forms, specifics thereof have been shown by way of example in the drawings and will be described in detail. It should be understood, however, that the intention is not to limit the invention to the particular example embodiments described. On the contrary, the invention is to cover all modifications, equivalents, and alternatives falling within the scope of the invention as defined by the appended claims.

DETAILED DESCRIPTION

In the following descriptions, the present invention will be explained with reference to various example embodiments; nevertheless, these embodiments are not intended to limit the present invention to any specific example, environment, application, or particular implementation described herein. Therefore, descriptions of these example embodiments are only provided for purpose of illustration rather than to limit the present invention. The various features or aspects discussed herein can also be combined in additional combinations and embodiments, whether or not explicitly discussed herein, without departing from the scope of the invention.

Referring to FIGS. 1-7, a solar generator 100 is shown according to an example embodiment. The generator 100 generally comprises a base 102, a rotating table (turntable) 103 provided to the base, a solar array 104 disposed atop the turntable 103 and a cover or dome 106 that is fastened atop the base 102 to define an enclosure surrounding the solar array 104 and turntable 103. The solar array comprises multiple separate solar cell assemblies that will be referred to hereinafter as solar elements 114.

The dome 106 can be primarily formed of a transparent or semi-transparent plastic material. The material can be chosen, or a film/coating applied thereto, to filter out certain wavelengths of light, such as infrared (IR) and/or ultraviolet (UV) wavelengths, which can adversely affect the solar cells and other enclosed components without contributing to the generation of electrical power. For example, the dome can be formed of a material that is infrared light (heat) blocking yet visibly translucent. This allows the visible light to pass, which the solar array can convert into electrical energy, but prevents the IR light from hitting the system components and, thereby, increasing their temperature and decreasing the efficiency of the solar cells. In another example, the IR light spectrum is filtered out but visible light and UV spectrums are allowed to pass through to the solar cells. In yet another alternative, the dome can absorb the undesirable spectrum of light and re-radiate that spectrum out or redirect it to a radiative cooling system.

The solar generator 100 can also be configured to omit the dome 106 entirely. In a further alternative, the dome 106 can be segmented so that it only covers the solar cells rather than the entire apparatus. Each cell or panel can also be covered with its own dome. In yet a further alternative, a series of domes can be employed such that each row of cells is covered by an independent dome.

The turntable rotates about a center axis to change the azimuth orientation of the solar array 104. An azimuth motor 108 is provided to the turntable 103 in order to rotate the turntable 103 relative to the base 102. This allows the solar generator 100 to adjust in the azimuth or rotational direction of the solar array 104. The azimuth motor 108 can also be mounted to the base 102 instead of the turntable 103 such that the motor in the base 102 turns the turntable 103.

A motor control unit 110 (also referred to as a motor controller) is disposed in the base 102, on the turntable 103, elsewhere within the enclosure or in an external space adjacent to the enclosure. The motor control unit 110 can also be housed within its own sub-housing for added protection. The motor control unit 110 includes a processor and non-transitory memory. Software code is stored in the non-transitory memory and executed by the processor to provide the described functionality of the motor control unit 110 described herein.

The motor control unit 110 is programmed to control the actuation of the azimuth motor 108 to turn the table 103 in a desired azimuth orientation so that the solar array 104 mounted to the turntable optimally faces towards the sun as the sun travels across the sky. The motor control unit 110 also can be programmed to control operation of one or more elevation motors 112. The elevation motor adjusts the elevation angle of the solar elements 114 in the array 104, as will be discussed below.

A skew angle of the solar elements 114 can also be adjusted in certain embodiments by the motor control unit 110 controlling a skew motor coupled to the solar elements 114 such that their skew angle can be adjusted.

The sun can be tracked, in one example embodiment, via information supplied to the motor control unit 110 by a wirelessly connected (e.g. via Bluetooth or Wi-Fi) smartphone or other mobile computing device that possesses GPS decoding, compass and time tracking capabilities. In such embodiment, the motor control unit 110 is coupled with or provided with the corresponding wireless transceiver component to connect with the mobile computing device.

Alternatively, the solar generator 100 can include onboard GPS decoding components, a compass and time tracking capabilities. The components providing these features can each be coupled to or provided to the motor control unit 110. The motor control unit 110 can then be programmed to track the sun based upon the location (via GPS), heading (via compass) and sun elevation (time of day and date) because the position of the sun relative to the solar cells can be calculated from such data.

Other sun tracking methods can also be utilized. For example, the method of tracking of objects in the sky disclosed in U.S. Patent App. Publication No. 2017/0237161 A1 can be used in the present invention. The disclosure of U.S. Patent App. Publication No. 2017/0237161 A1 is fully incorporated herein in its entirety.

Another tracking method includes measuring relative power of two or more solar elements 114 in different locations in the solar array. Any two of the solar elements 114 equidistant from a midline in a given axis should be expected to generate equivalent power amounts within a certain tolerance and assuming no shading. The motor control unit 110 can be programmed to actuate the azimuth motor 108 until the two solar elements 114 generate equivalent power within the predetermined variance. This is repeated for each axis. The respective power outputs of the two solar elements being compared can be constantly monitored to move the solar elements 114 as the sun moves across the sky and, if necessary, as the solar array itself moves and turns if mounted to a moving vehicle so that the sun is actively tracked.

Elevation can be adjusted in a similar manner by monitoring a measurement of an upper portion and a lower portion of a given solar element 114 (or corresponding upper and lower parts of two different elements in the array) and then actuating the elevation motor 112 to achieve a balance state where the collection cells of the solar array 104 are oriented approximately perpendicular to the inbound solar radiation.

Figure 32:
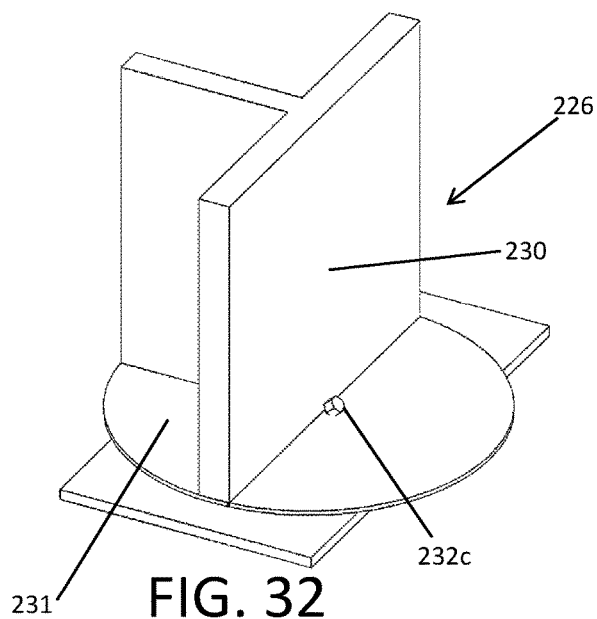
FIG. 32 is a perspective view of a solar sensor for a solar power generator in accordance with certain example embodiments.
Figure 33:
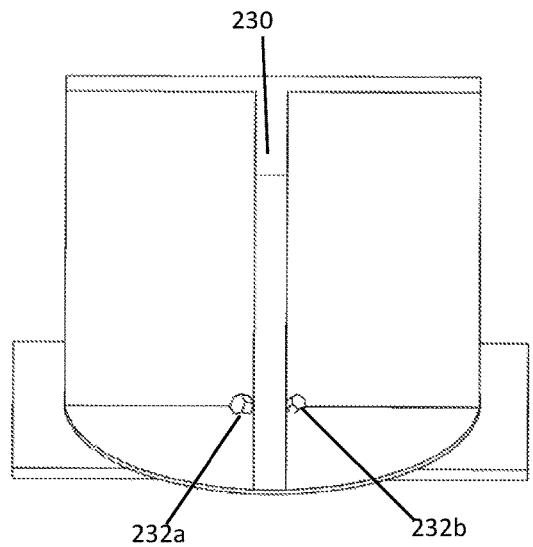
FIG. 33 is another perspective view of the solar sensor of FIG. 32 in accordance with certain example embodiments.
Figure 34:
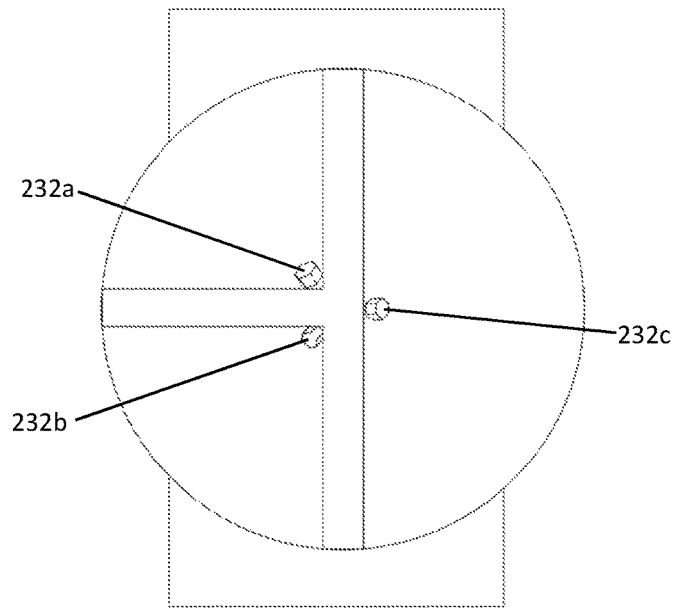
FIG. 34 is a top view of the solar sensor of FIG. 32 in accordance with certain example embodiments.

A further tracking method that can be employed uses a solar sensor that will be discussed herein below with respect to FIGS. 32-34.

Power for the motors 108, 112 and the motor control unit 110 can be supplied by an onboard battery 113. The battery can be contained inside of the same housing as the motor control unit 110. The battery 113 is charged by the solar array 104. Alternatively, power can be supplied to the battery 113 and motor control unit 110 from an external source coupled to the solar generator.

The motor control unit 110 can be programmed with a software implemented algorithm to maximize power output by balancing potential power output of the solar array 104 with the power consumption necessary to move the orientation. Thus, if the array 104 can provide significant energy production above a preset threshold because there is significant solar radiation present, it can be justified to actuate the motors 108, 112 to move the array 104 orientation often. But if the array 104 cannot generate power above the preset threshold because, for example, it is cloudy or the array is shaded, movements of the array 104 can be minimized to conserve energy. A further threshold can also be set below which the motor control unit 110 will not move the array 104 at all because it is assumed that the sun is below the horizon.

Referring more particularly to the individual solar elements 114 in FIGS. 1-6, it can be seen that each element 114 comprises one or more solar cells 116 defining a solar cell segment 118 that is surrounded by a reflective surround 120 around the outer perimeter of each cell segment 118. The reflective surround 120 aids in collecting solar radiation for the cells 116 so that an increased amount of light is received by each cell, thereby increasing the overall energy output of the generator.

The reflective material used for the reflective surrounds 120 can be chosen to only reflect certain wavelengths of light (e.g. visible light) while permitting other wavelengths (e.g. IR) to pass through the reflector in order to minimize the heating effect on the solar cells. Heating of solar cells decreases their efficiency and energy output. For example, the reflector portions can be provided with or configured as diffraction gratings. Note that each "cell" referenced in this application can also refer to a solar panel segment that may include multiple individual cells.

The reflective surround 120 in FIGS. 1-6 wraps around the perimeter of each individual solar cell segment 118. This results in an increase in the capture of light, a decrease in light leaking or being reflected away from the solar cells 116, and decreases the overall size of the solar generator system for a given wattage rating of the solar cells employed. This also maximizes the output of each individual cell elements 114 in the array, which is important on sunny days so that the generator can achieve maximum light saturation on each cell (which gives us the maximum energy production) and is crucial on days with low solar coverage because it prevents any single cell from being completely shaded, which would suppress the power output from all other cells in series behind it.

The angle of the reflective surround 120 with respect to the cell segment 118 is chosen to reflect the incoming light onto the cell segment surface. For example, an angle of 38 degrees from the normal (52 degrees from the surface of the segment 118) can be employed. In addition, the intersecting ends of the surround 120 can be angled to define facets 122 to further add to the amount of light reflected. For example, a facet angle of 130 degrees can be defined between the facet's surface and the adjacent reflector segment surface. Other angles for each of the reflector surfaces can be used in other embodiments.

Each of these angled reflector surfaces supplies an increased amount of light to the solar cells of the solar elements 114, thereby increasing the energy output of the solar elements 114 without significantly increasing the solar cell temperature, which would decrease their efficiency and energy output. Thus, the reflector surround 120 and facets 122 can be configured to double, triple, or quadruple the amount of light that would otherwise hit the solar cells of the solar elements 114.

The reflectors 120 can be static or they can be configured to move independently of the solar cell planar surfaces 118 to maximize the amount of light reflected onto the solar cells. For example, the reflection angle can be adjusted electronically with motors or other actuators, such as piezoelectric actuators, coupled to the reflectors 120. The adjustment is controlled by the motion control unit 110.

Another feature of the solar array is the advantageous arrangement of each of the solar elements 114. The elements 114 are arranged side-by-side in multiple rows. The rows are spaced-apart such that each row can be constantly adjusted to be oriented towards the sun while minimizing the likelihood of shading other solar elements 114 in adjacent rows. Thus, the solar elements 114 can receive the maximum solar energy per area/volume.

Each row of solar elements 114 is connected to a linkage 124 so that a single elevation motor can adjust the tilt angle (elevation) of all solar the elements simultaneously. As shown in the figures, each row is secured via a fixed pivot 126. Then a common link 128 of the linkage 124 pivotally attaches to each row spaced apart from the axis of the fixed pivot 126. Each element 114 in a given row is commonly coupled together. Thus, each row will tilt simultaneously with the other rows so that only one row (or the common link) needs to be actuated by the elevation motor. This also provides for each and every solar element 114 to pivot simultaneously such that only one of the elements 114 needs to be aimed to cause the remaining elements to be simultaneously aimed.

Placing the pivot's 126 location at or near the midpoint of the side of the solar elements 114 allows the elements 114 to pivot forward from horizontal by potentially up to ninety degrees and backward from horizontal by potentially up to ninety degrees (or some lesser degree depending on clearance and travel of the linkage). Thus the total travel can be up to 180 degrees in total depending on the particular configuration.

A screw drive can be coupled to one solar element 114 in one of the rows to drive the elevation of the remaining elements 114. Alternatively, a crank link can be coupled to one end of the common link 128 and driven by the elevation motor. Of course, other mechanisms for tilting the rows of cells with an elevation drive motor can be employed. Each row can also be separately driven with its own motor.

The azimuth orientation is changed by rotating the turntable 103 with respect to the base 102. The azimuth motor can be coupled, for example to the turntable and turn a pinion gear coupled to the motor's output shaft that engages the base 102 so that the turntable 103 can be rotated via the motor. Rotating the turntable 103 simultaneously changes the azimuth for all the solar elements 114 since the entire array 104 of elements 114 is mounted atop the turntable 103.

Elevation and azimuth orientations can be adjusted independently.

Each individual solar element 114 in a row can also be independently movable in some embodiments. Each solar element 114 can be mounted on a movable base that can be adjusted with motors, linkages, and/or other actuators to move the element in any axis needed to maximize the collection of light. The movement can be controlled by the motor control unit 110 being coupled to the actuator(s) employed. In this embodiment, the elements can alternatively be arranged such that they are not side-by-side in rows so that the cells do not shade one another.

The potential for shading of a given element 114 by another in an adjacent row is reduced by mounting each row at a different vertical height in the same manner as rows of seats in a stadium. This can be seen, for example with reference to FIGS. 2 and 7 where the lowermost pivot point for each row is progressively vertically higher above the turntable 103 as the rows progress from front (solar collecting side) to back.

The frame structure 130 on which each solar element 114 is mounted can be formed of aluminum for maximum heat conduction away from the solar cells. A heat sink 132 can also be thermally coupled to each solar element 114 for further heat dissipation.

An intake vent 134 and exhaust vent 136 can be defined in the dome 106 and/or base 102 to allow heat to passively escape the enclosed space inside of the solar generator 100. A ventilation fan can also be provided to either of the vents to actively vent the enclosure. The vent fan and a temperature sensor can be coupled to the motor control unit 110 to monitor and actively vent the enclosure as needed. Power for the fan can be supplied by the onboard power source if so equipped.

Infrared radiation and heat built up within the enclosure, and within the various components, can be collected and used. For example, a thermocouple can be provided to produce energy. The built up heat energy can be circulated to a remote location to heat a load such as a hot water tank or an air exchanger to heat forced air entering a truck cabin. The built up heat could also be used to drive a turbine and generator to produce further electrical power.

In a further aspect, the user can also be provided with the option for "manual" actuation of the drive motors. In such embodiment, the user can manually push actuation buttons via the app or via buttons provided to the base of the generator, or via a dedicated remote control device. A semi-automatic operation mode can also be provided where the motion control unit 110 automatically alters at least one of the orientations (e.g. azimuth) and the user manually alters at least one other of the other orientations (e.g. elevation or skew).

The solar generator 100 disclosed herein is configured to increase the energy production from solar panels as compared to a conventional panel, which increases the relative energy production per unit area of solar cell and the energy production per unit cost.

The solar generator in certain embodiments uses either on-board GPS, compass, and time/date data to automatically calculate solar orientation or via wireless tether to a mobile device such as a phone for GPS, compass, and time and date data. The generator does the above calculation in real time and in-motion enabling solar tracking while in motion.

The solar generator and its systems can be self-powered. For example, a battery can be provided onboard the generator to power the motors and motor control unit. The motor control unit can include a charge controller to manage the charging of the onboard battery.

The solar generator can intelligently optimize its orientation according to a conservation algorithm to maximize the difference between the solar panel's power output and the system's power draw.

The solar generator can also be configured with an onboard battery for energy storage and an onboard power inverter to provide an all-in-one power generation, storage, and supply system. In such embodiment, a plug of a suitable type can be provided to the base so that the user can plug in an electronic device that is desired to be powered directly by the solar generator.

The generator can be configured as an enclosed system, protecting it from environmental hazards such as inclement weather, wind, and debris. Thus, the solar cells are not damaged and do not need to be cleaned.

The dome 106 of the enclosure also can be configured to protect the solar cells and reflectors from heat while still transmitting the visible light necessary for energy production.

The dome 106 of the enclosure can further be formed of, or coated with, a hydrophobic or super hydrophobic coating to minimize moisture that may accumulate on the outside of the dome. The hydrophobic coating also increases the solar output of the cells by keeping the covering clean.

The pivoting and rotating mechanisms allow the entire array of solar elements 114 to be moved together so that a minimum number of drive motors/actuators are required.

The reflectors 120 provided to each solar element 114 provides for an increase in light saturation on the solar cells without increasing their temperature, which maximizes their efficiency.

The overall vertical height of the solar generator 100 is relatively low profile. For example, the height can be nine inches or less. Such small height would not be possible with a conventional single plane solar panel of the same nominal power rating that is tiltable in elevation with a reasonable tilt range. Thus, the present solar generator is well suited to installations where maximum height is a concern, such as in RV and truck installations.

Figure 8:
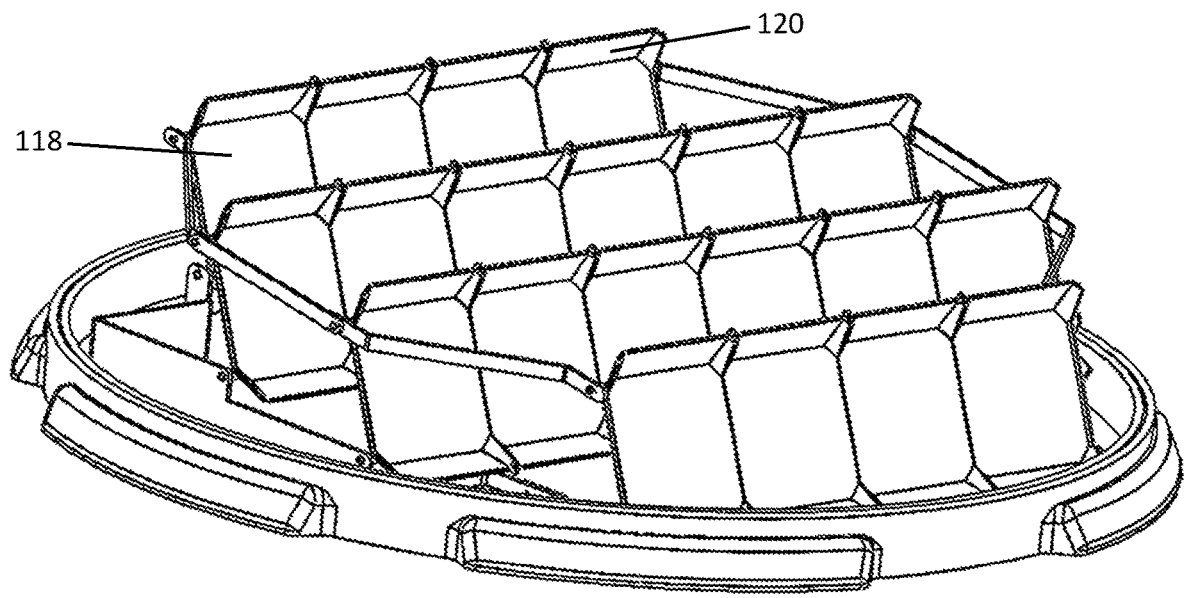
FIG. 8 is a perspective view of a solar power generator in accordance with certain example embodiments.
Figure 9:
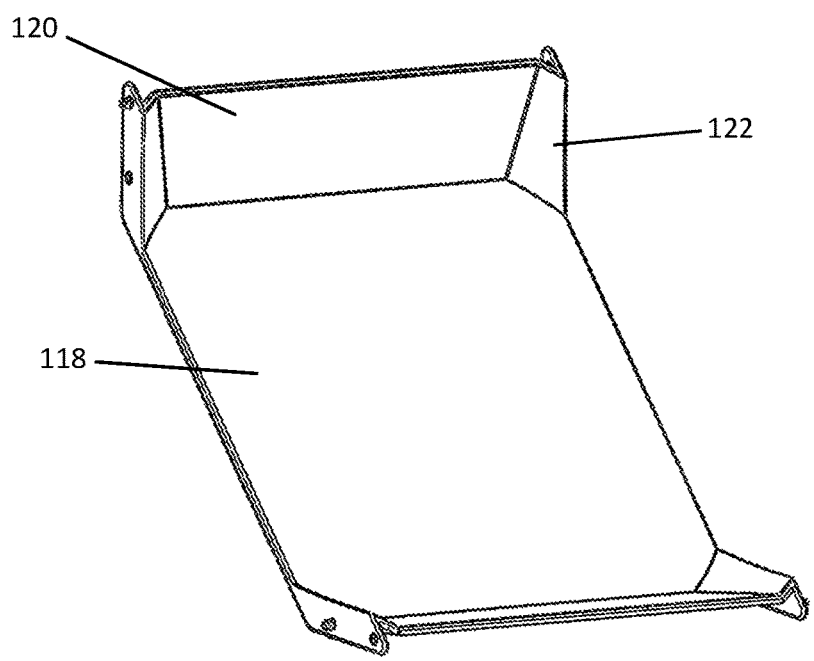
FIG. 9 is a perspective view of a solar element of a solar power generator according to certain example embodiments.

FIGS. 8-9 show an alternative embodiment where the reflector 120 is located only at the top and bottom sides of the segment 118 of the solar element 114. The faceted surfaces 122 are still located at the corners of the segment 118. This arrangement allows the individual elements 114 to be more closely located to one another in a given row.

Figure 10:
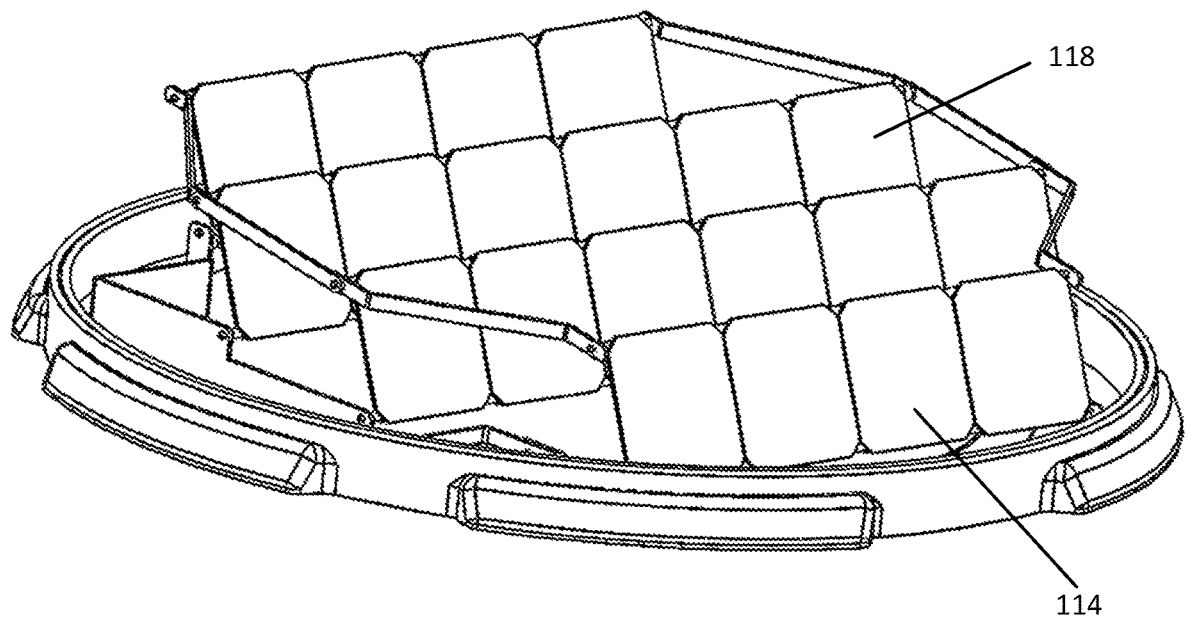
FIG. 10 is a perspective view of a solar power generator in accordance with certain example embodiments.
Figure 11:
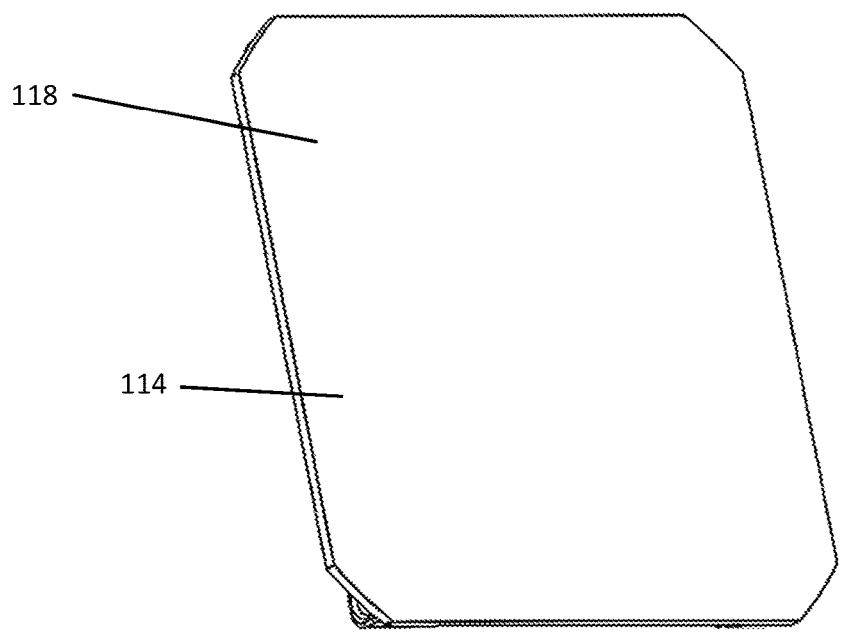
FIG. 11 is a perspective view of a solar element of a solar power generator according to certain example embodiments.

FIGS. 10-11 show an alternative embodiment where the segment 118 of the solar element 114 has no reflector whatsoever along its sides.

Figure 12:
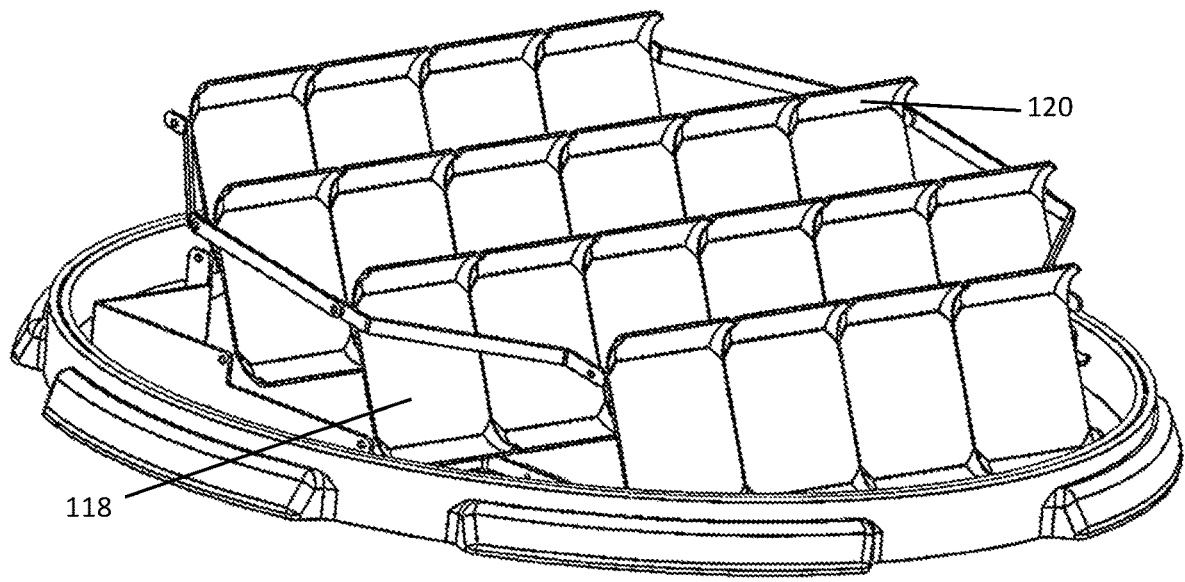
FIG. 12 is a perspective view of a solar power generator in accordance with certain example embodiments.
Figure 13:
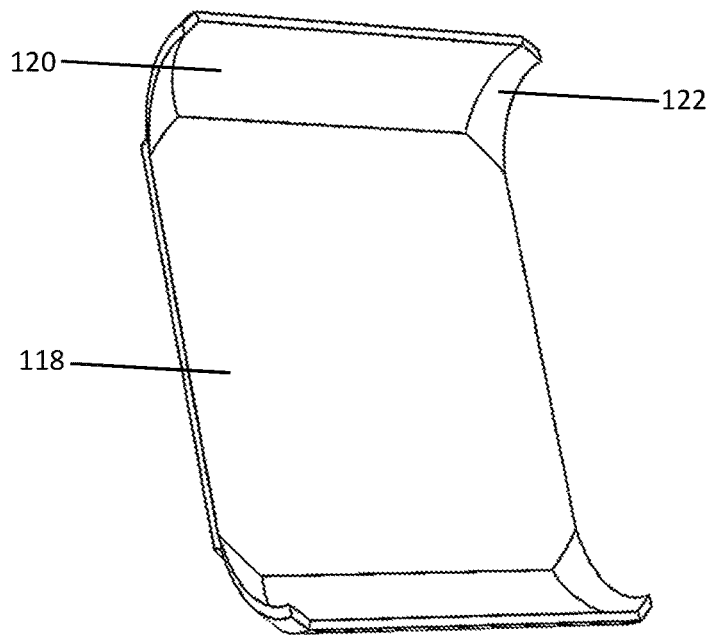
FIG. 13 is a perspective view of a solar element of a solar power generator according to certain example embodiments.
Figure 14:
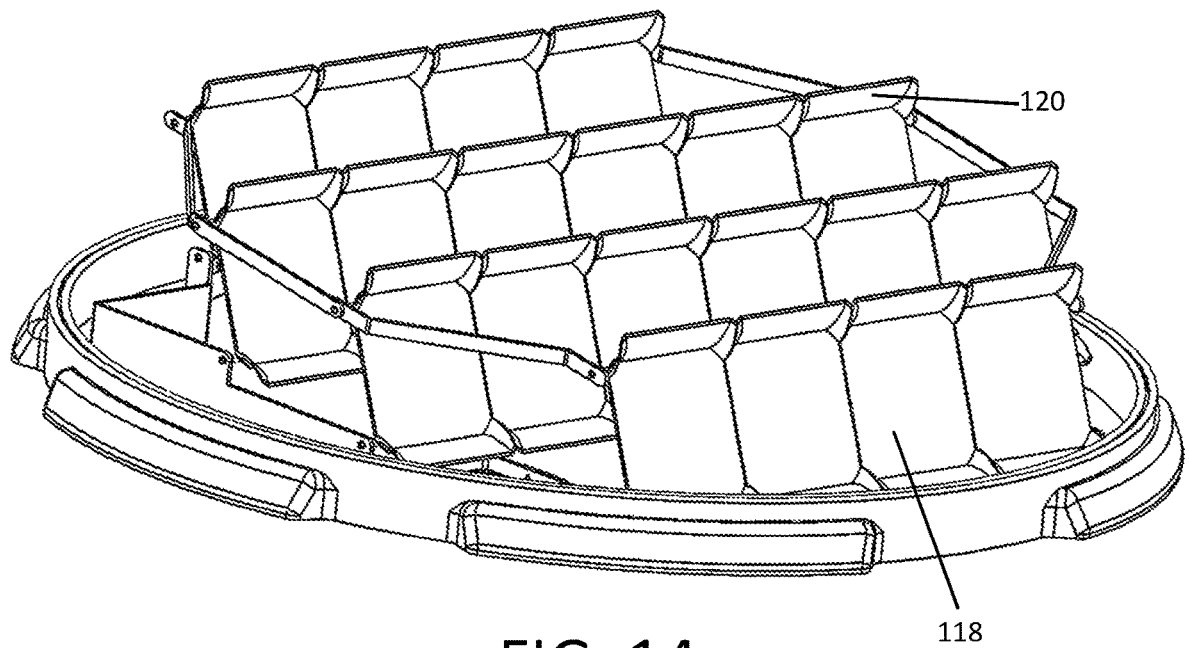
FIG. 14 is a perspective view of a solar power generator in accordance with certain example embodiments.
Figure 15:
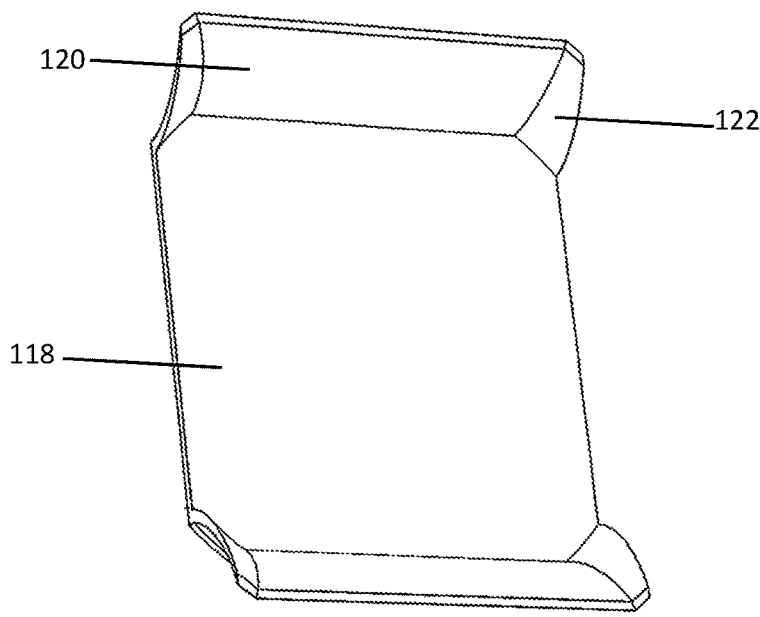
FIG. 15 is a perspective view of a solar element of a solar power generator according to certain example embodiments.

FIGS. 12-13 show an alternative embodiment similar to FIGS. 8-9 except the reflector 120 is now concave curved. The reflector 120 segments can also be convex curved as shown in FIGS. 14-15. The concave or convex curvature of the reflector 120 segments can reflect light from a variety of angles so that scattered light and imperfect alignment can still be reflected towards the solar cell surfaces.

Figure 16:
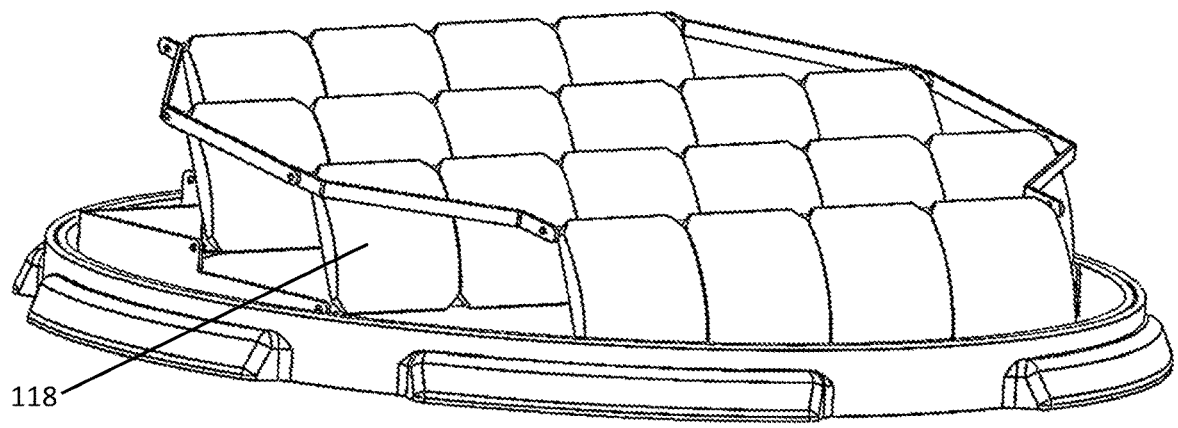
FIG. 16 is a perspective view of a solar power generator in accordance with certain example embodiments.
Figure 17:
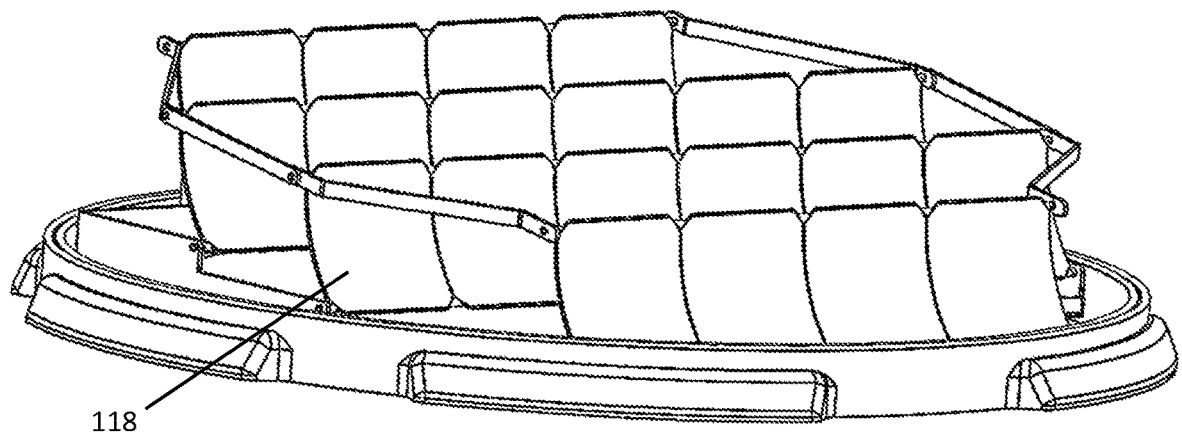
FIG. 17 is a perspective view of a solar power generator in accordance with certain example embodiments.

FIG. 16 shows an alternative embodiment where the segment 118 of the solar element 114 is convex curved rather than planar. The segment 118 of the solar element 114 can also be concave curved as shown in FIG. 17. The concave or convex curvature of the solar cell segment 118 can collect light from a variety of angles so that scattered light can be collected and so that some degree of imperfect alignment can be tolerated without significant degradation in solar energy collected.

Figure 18:
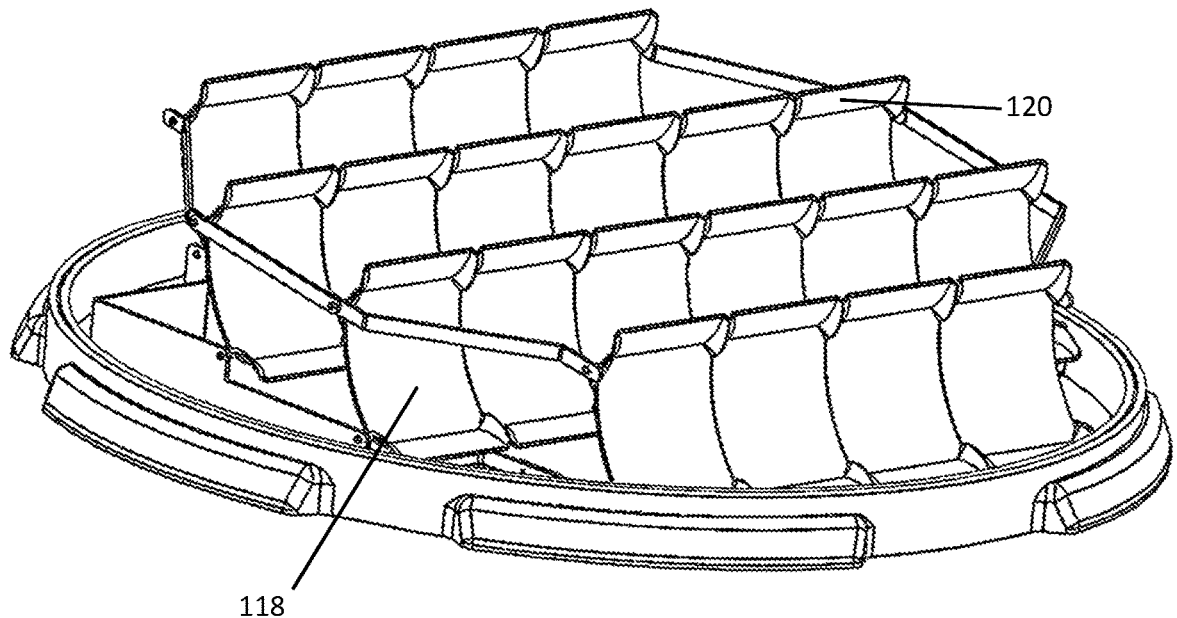
FIG. 18 is a perspective view of a solar power generator in accordance with certain example embodiments.
Figure 19:
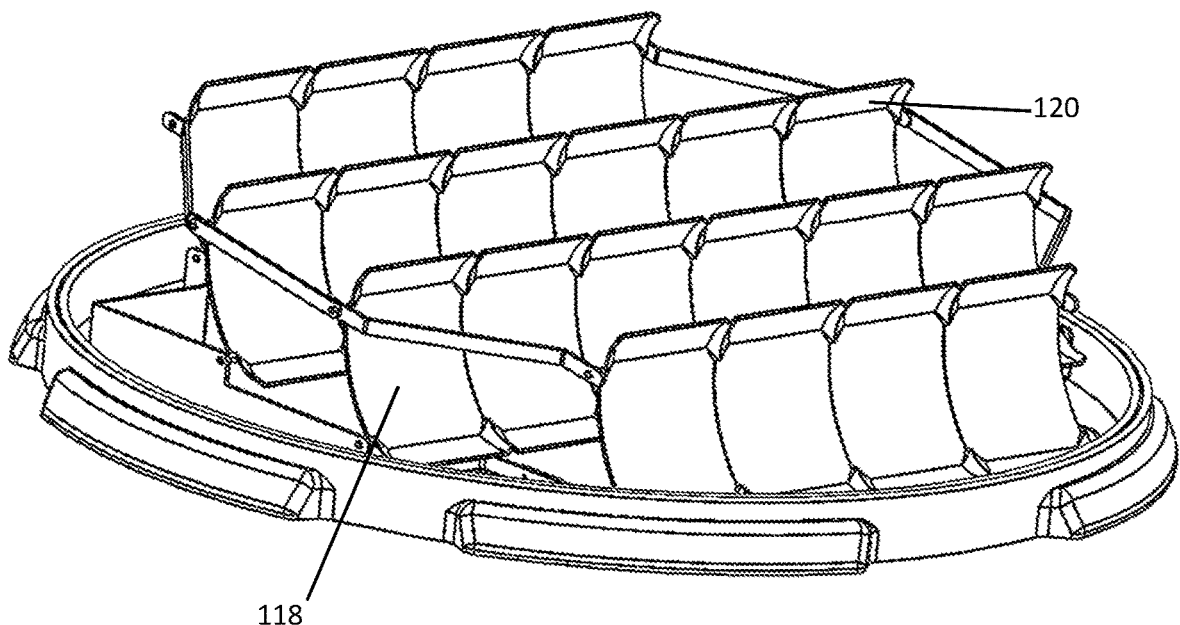
FIG. 19 is a perspective view of a solar power generator in accordance with certain example embodiments.
Figure 20:
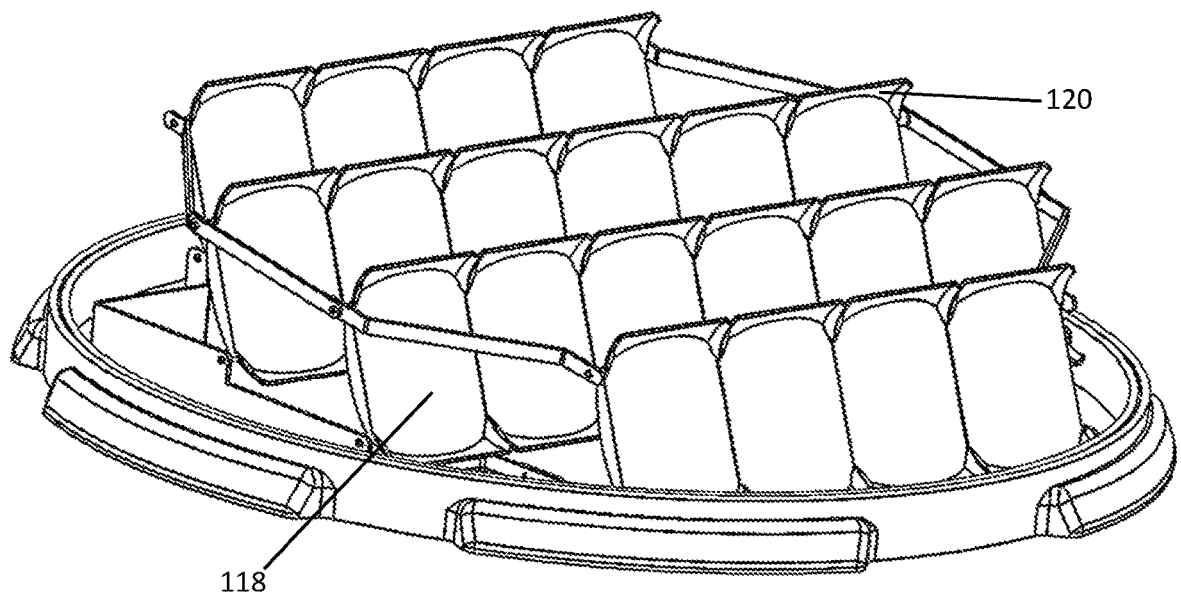
FIG. 20 is a perspective view of a solar power generator in accordance with certain example embodiments.
Figure 21:
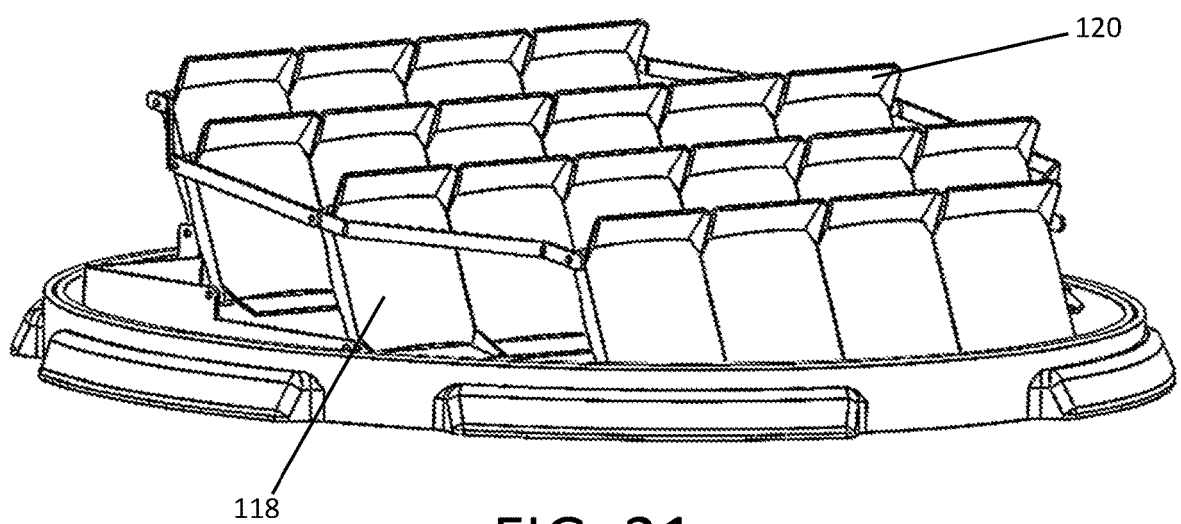
FIG. 21 is a perspective view of a solar power generator in accordance with certain example embodiments.
Figure 22:
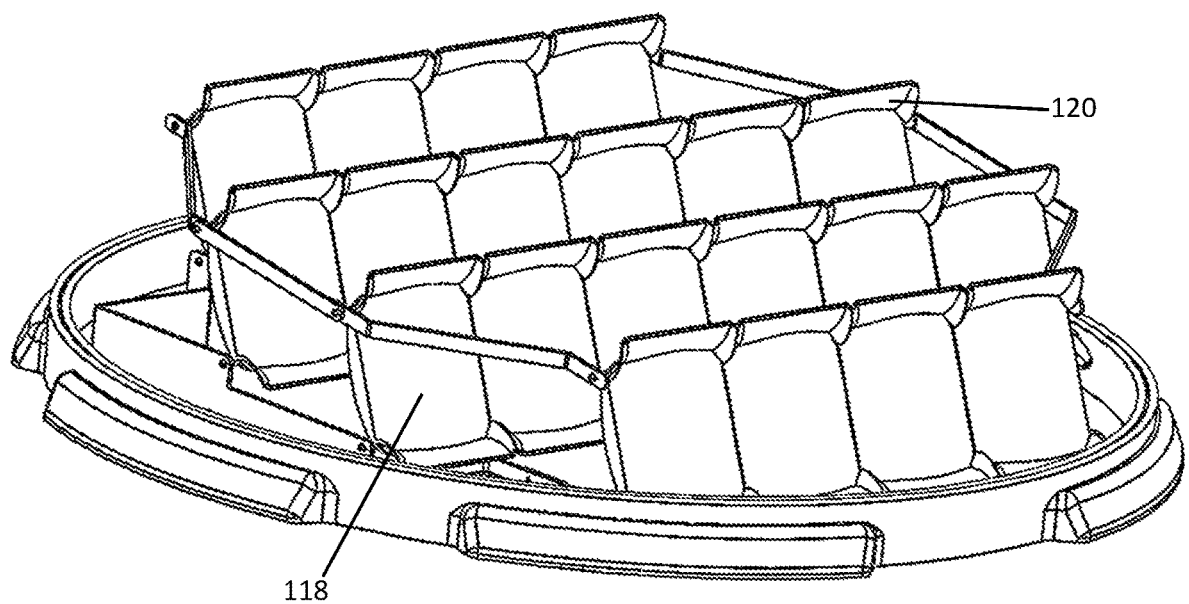
FIG. 22 is a perspective view of a solar power generator in accordance with certain example embodiments.
Figure 23:
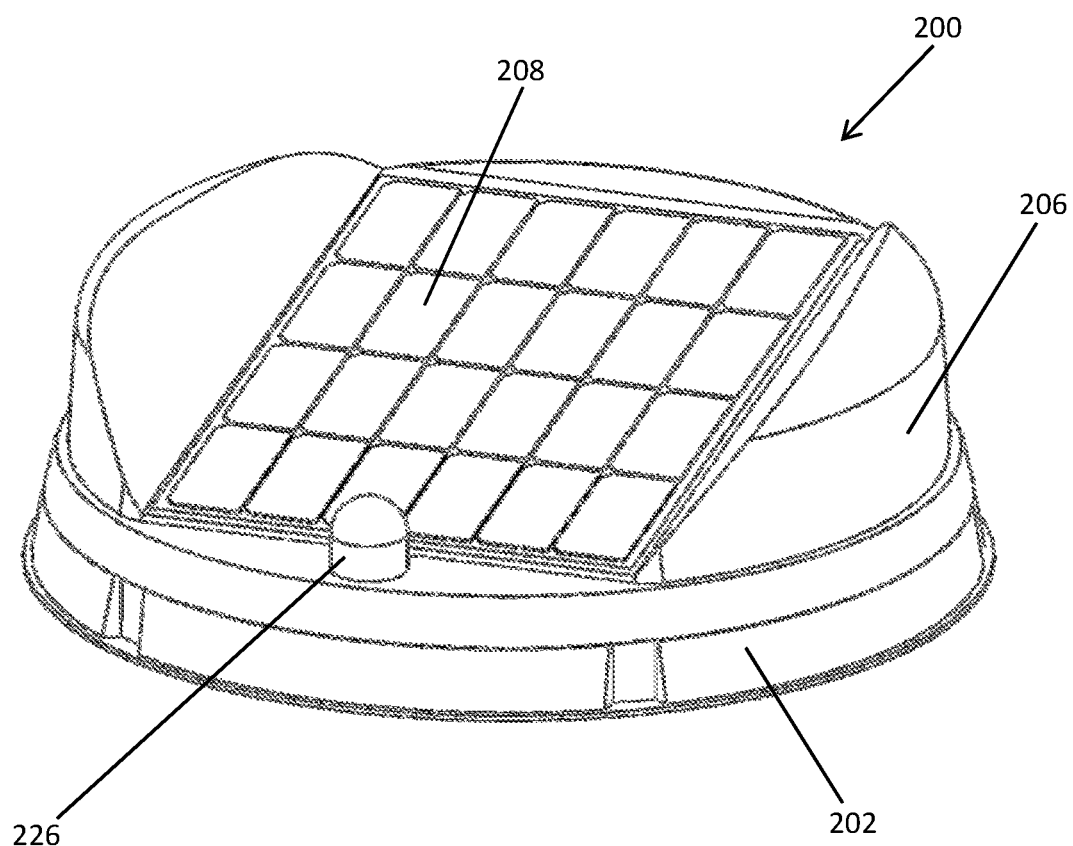
FIG. 23 is a perspective view of another solar power generator in accordance with certain example embodiments.
Figure 24:
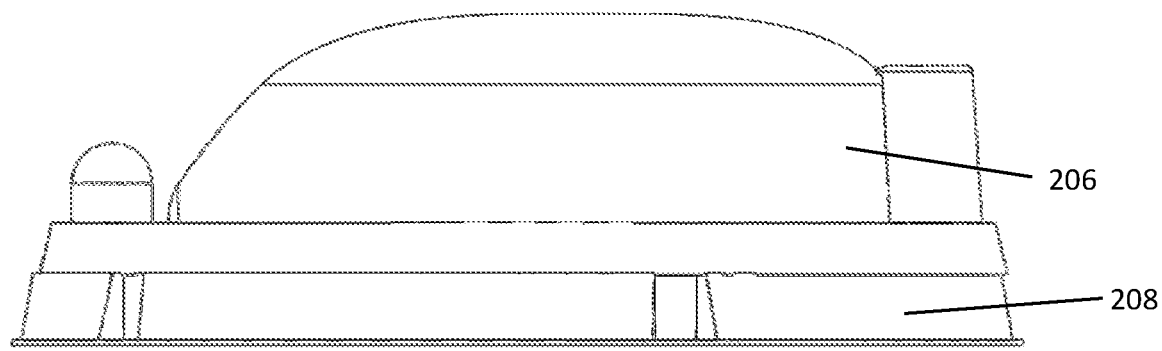
FIG. 24 is a side view the solar power generator of FIG. 23 in accordance with certain example embodiments.
Figure 25:
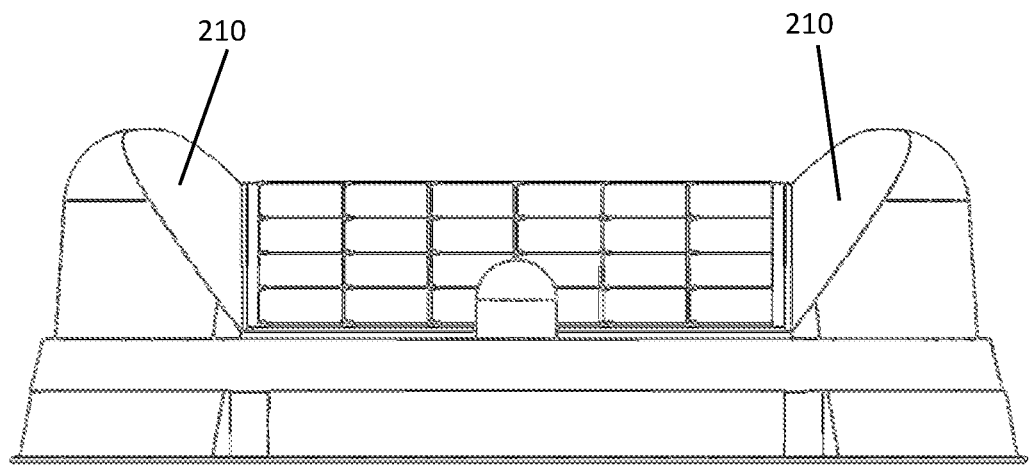
FIG. 25 is a front view the solar power generator of FIG. 23 in accordance with certain example embodiments.
Figure 26:
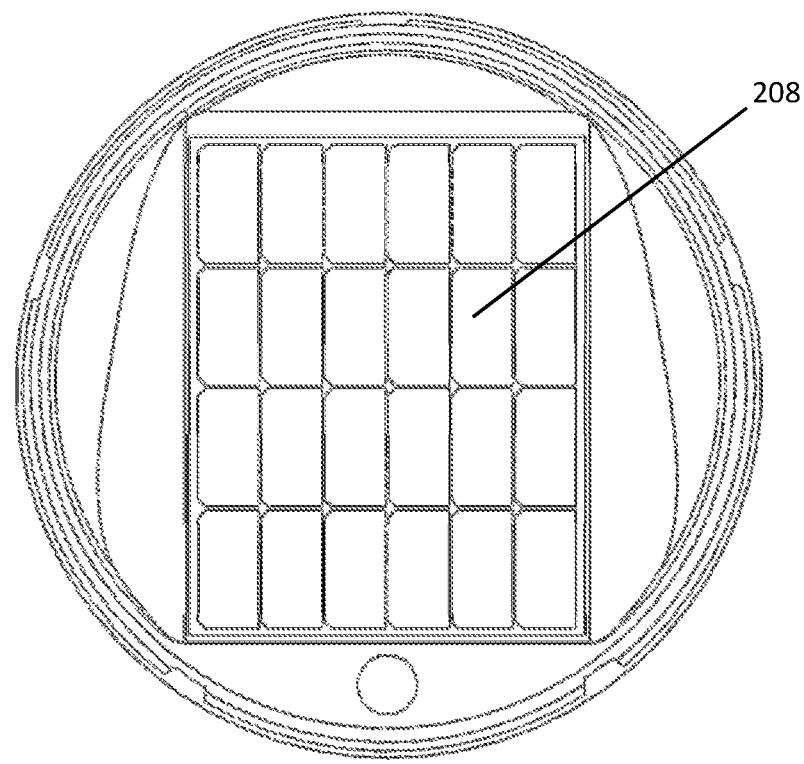
FIG. 26 is a top view the solar power generator of FIG. 23 in accordance with certain example embodiments.
Figure 27:
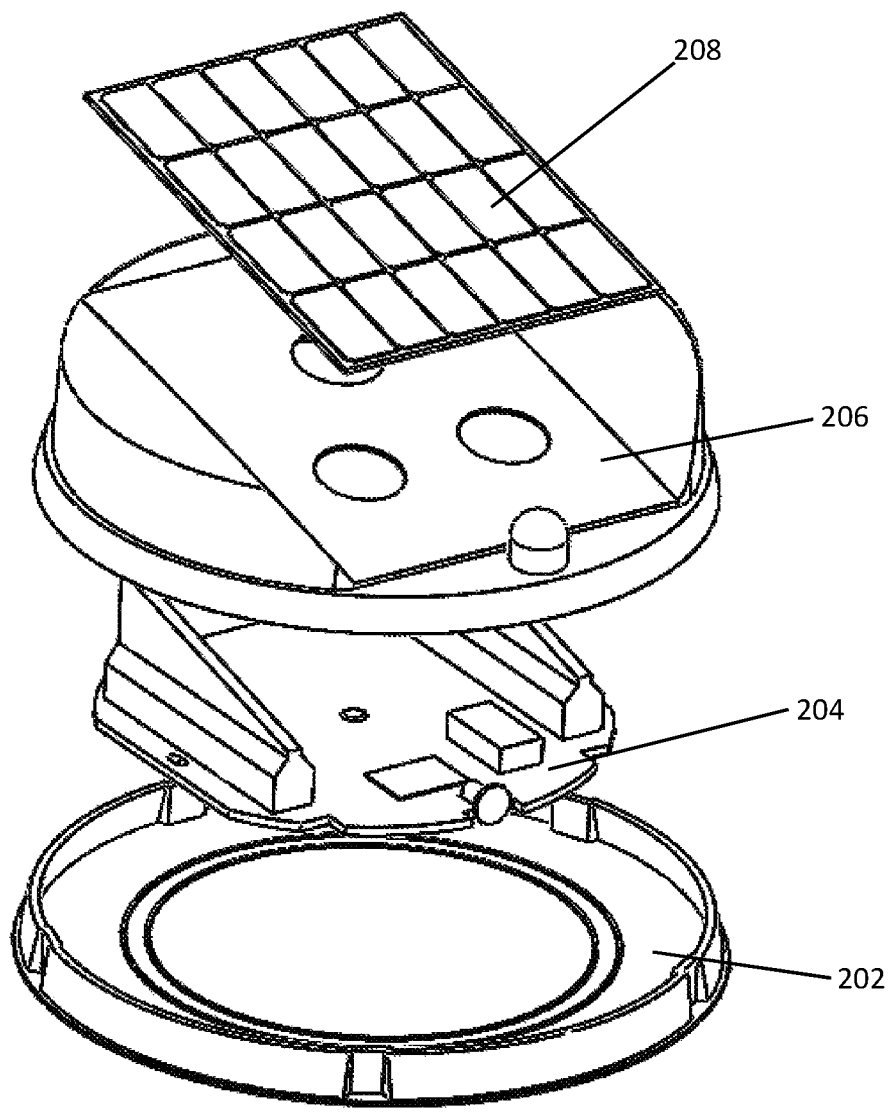
FIG. 27 is an exploded perspective view the solar power generator of FIG. 23 in accordance with certain example embodiments.

The solar elements 114 in FIGS. 16-17 do not have reflectors 120. However, reflectors can be provided to such embodiments as shown in FIGS. 18 and 22 (convex), FIG. 19 (concave) and FIGS. 20-21 (straight).

The solar cell segments 118 of the solar elements 114 can also be curved in two directions and can be spherically curved as well. The various curvature options for the planar surfaces 118 and for the reflectors (including the no-reflector option) can be mixed and matched in various embodiments even if not explicitly described herein.

Referring next to FIGS. 23-27, a further embodiment of a solar generator 200 will be discussed. The generator 200 generally comprises a base 202, a rotary plate 204 disposed in the base, a cover 206 disposed atop the rotary plate and a solar panel 208 disposed atop the cover. The solar panel 208 comprises multiple separate solar cells or assemblies that are arranged in a common plane. Unlike the previous embodiment, the solar cells are not covered.

The solar panel 208 is arranged so that it is angled with respect to the horizon to improve radiation collection and to shed moisture. The angle (for example 12 degrees from horizontal) is fixed in the depicted embodiment. However, a tilt adjustment can be added. The tilt adjustment mechanism can be that employed in the previous embodiment, or could be a screw jack or other motorized means.

Further aiding in the collection of solar radiation are the reflective side panels 210 disposed laterally along the solar panel's sides. The angle of the sides 210 is such that the inbound radiation reflects onto the panel (e.g., 40 degrees from vertical), thereby increasing the effective collection size of the solar panel 208. A mirrored material, metallic coating or other reflective material is applied to the reflecting surfaces of the side panels 210 to enhance reflection of the solar radiation onto the panel 208.

Figure 28:
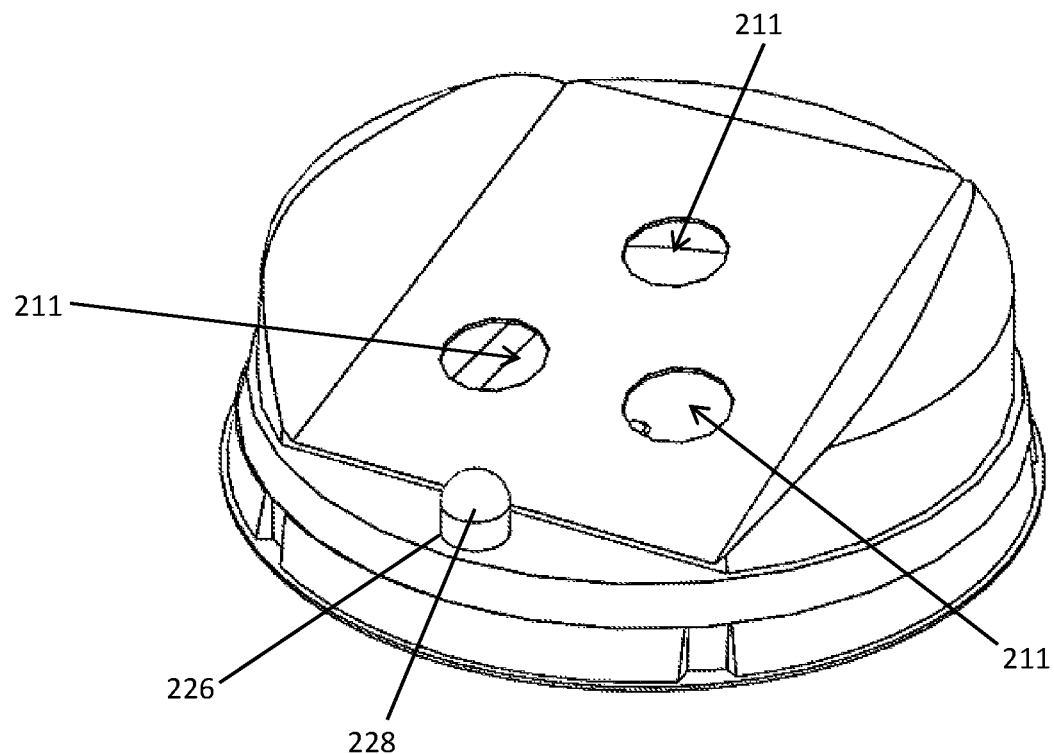
FIG. 28 is a perspective view of a portion of the solar power generator of FIG. 23 in accordance with certain example embodiments.

The solar panel fastens to the outer surface of the cover 206. As shown in in FIG. 28, there are holes 211 though the cover underneath the placement of the panel 208 so that wiring from the panel can pass through the cover 206. The holes also allow one to access the electronics located atop the rotary plate 204. The cover 206 rotates freely atop the base 202 as the cover turns with the rotary plate 204.

Figure 29:
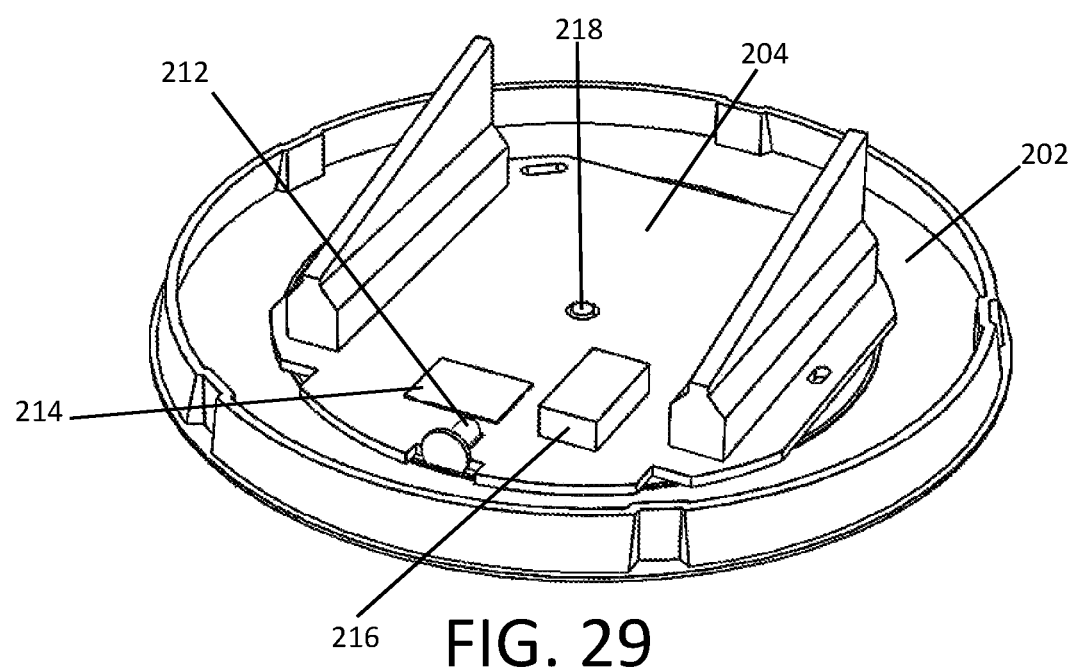
FIG. 29 is a perspective view of a portion of the solar power generator of FIG. 23 in accordance with certain example embodiments.

FIG. 29 shows the cover 206 removed to reveal the rotary plate 204 atop the base 202. The rotary plate 204 rotates with respect to the base 202 by the actuation of an azimuth motor 212. Control electronics 214 (e.g., motor controller and charge controller) are also mounted on the rotary plate 204. Further, a battery 216 or other energy storage device is secured to the rotary plate 204 to power the motor and electronics, and to store energy generated by the solar panel 206. No external power supply is needed because the power required to operate the generator 200 is self-generated and stored onboard.

A slip ring 218 is provided at the center axis of the rotary plate 204 so that power generated by the solar array can be coupled out of the generator device 200. The slip ring allows the rotary plate to infinitely rotate through 360 degree revolutions without limitation of cable wrap.

Figure 30:
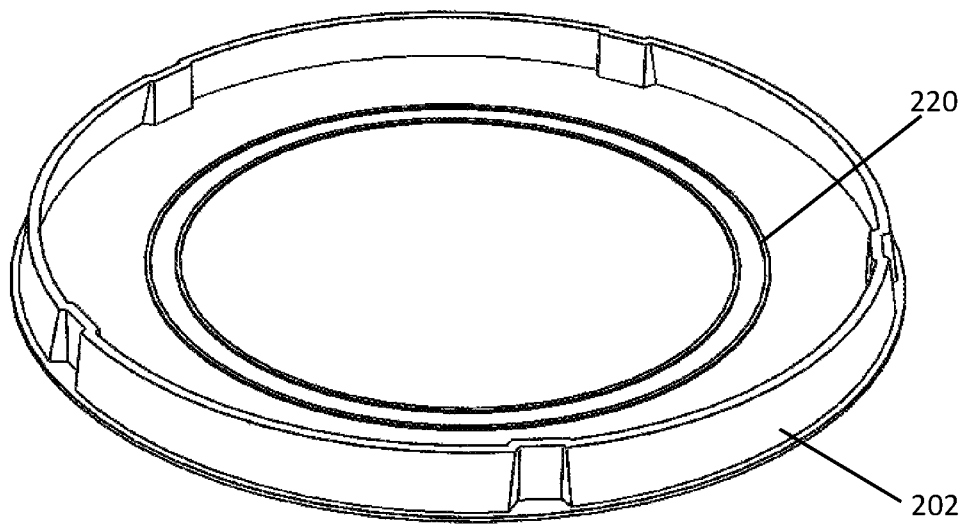
FIG. 30 is a perspective view of a portion of the solar power generator of FIG. 23 in accordance with certain example embodiments.
Figure 31:
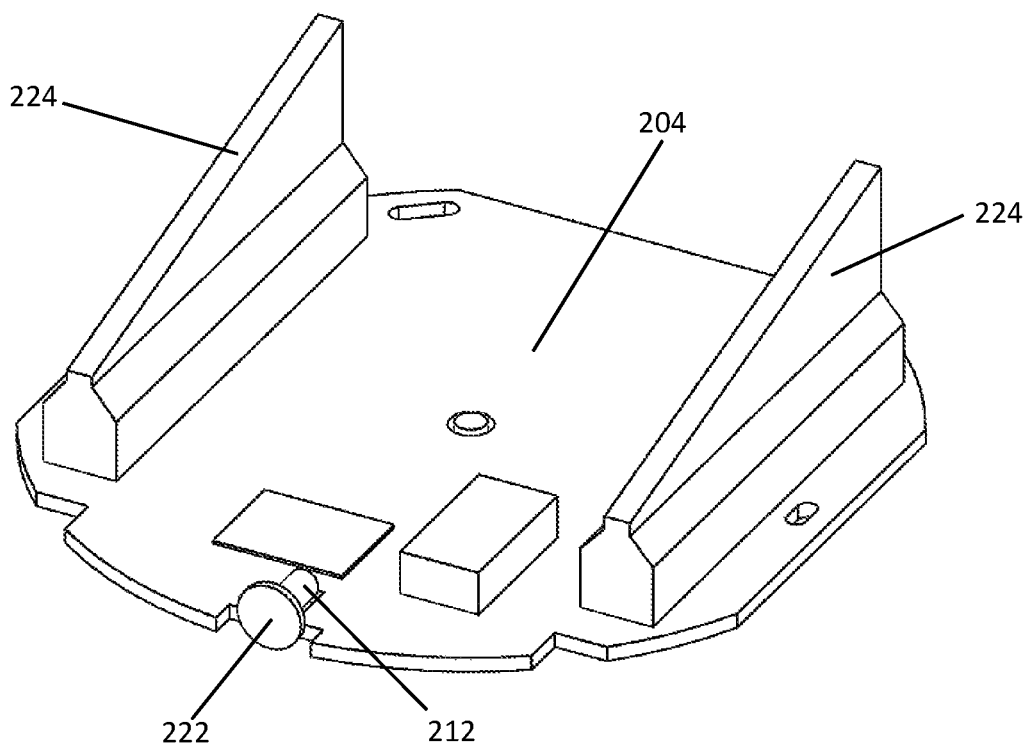
FIG. 31 is a perspective view of a portion of the solar power generator of FIG. 23 in accordance with certain example embodiments.

Referring now to FIGS. 30-31, tracks 220 are defined in the base 202 for a gear wheel 222 coupled to the motor 212 to engage to allow the motor 212 to turn the rotary plate 204. Of course, the tracks 220 could be defined in the bottom of the rotary plate 204 in alternative embodiments where the motor is stationarily secured to the base 202. A pair of vertically-extending cover supports 224 are also provided to the plate. The supports 224 extend upward into the side portions 210 of the cover 206.

A photosensor 226 is also provided to the solar generator 200 shown in this embodiment. The photosensor could also be provided to any embodiment of the invention. The purpose of the photosensor 226 is to sense the relative rotational positon of the solar panel or array with respect to the sun.

Referring to FIGS. 28 and 32-34, the photosensor 226 comprises a cover 228 disposed over a T-shaped vertical wall 230 that is disposed atop a base plate 231. A light sensor 232a, 232b, 232c is disposed on each separated side of the wall 230. The cover and base plate enclose the vertical wall 230 and light sensor 232a, 232b, 232c.

The T-shaped wall is aligned when secured to the generator such that the stem of the T-shaped wall 230 extends radially outward from the generator in the horizontal plane. The photosensor 226 is also preferably mounted along the lateral midline of the solar panel or solar array so that half of the cells are on each lateral side of the stem. The photosensor 226 is also mounted so that it rotates along with the solar panel/array. The outputs of the sensors 232a-c are coupled to the control electronics for the generator.

This alignment allows the sensors on each side of the stem portion to be measured to see if each side is receiving approximately the same amount of solar radiation (within a pre-set tolerance). When the readings are not in balance, the motor is energized to rotate towards the direction of the higher reading until the desired balance of the sensor readings is achieved. In this manner, the solar panel/array is always optimally aligned with the sun in the azimuth orientation.

Readings of the opposing side sensors 232a, 232b are taken periodically (e.g., every 5, 10 or 15 minutes) and the azimuth orientation of the array is adjusted to maintain optimum alignment. This process thus allows the sun to be tracked as it moves through the sky. The tracking process is automatic because it is automated by the control electronics being programmed to perform the tracking process described herein.

The tracking means and methods described herein also can be performed without any need for a location reference of the generator. Thus, it is not necessary for the user to pair their smartphone to the generator or otherwise supply a location data so that a location-based solar tracking algorithm can be used.

The sensor 232c located adjacent to the head of the T-shaped wall can be used to set a background or floor radiation reading so that the readings from the other sensors 232a, 232b can be attenuated or amplified to magnify any differences in the readings. The reading from this third sensor can also be used to determine whether the level of available solar radiation is below a threshold that the generator enters a sleep or off mode. Once the reading at sensor 232c is above this sleep threshold, the generator can automatically begin active tracking. Thus, the user need not turn the generator on/off manually.

The solar generators according to certain embodiments are self-contained and fully automated.

The solar generator can also be configured with a minimized height, such as less than 12 inches or less than 8 inches. This is advantageous when mounting atop a recreational vehicle, van or truck that must stay below maximum height requirements.

While the invention has been described in connection with what is presently considered to be the most practical and preferred example embodiments, it will be apparent to those of ordinary skill in the art that the invention is not to be limited to the disclosed example embodiments. It will be readily apparent to those of ordinary skill in the art that many modifications and equivalent arrangements can be made thereof without departing from the spirit and scope of the present disclosure, such scope to be accorded the broadest interpretation of the appended claims so as to encompass all equivalent structures and products.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A solar generator, comprising:
    a base;
    a rotary plate provided to the base such that the rotary plate can rotate with respect to the base;
    a cover disposed atop the rotary plate;
    a solar panel disposed atop the cover such that the solar panel is angled with respect to a horizontal plane;
    a motor provided to the rotary plate such that the motor can engage the base to enable rotation of the rotary plate with respect to the base; and
    a photosensor coupled to the rotary plate such that the photosensor rotates with the rotary plate, the photosensor comprising:
    a photosensor base portion;
    a T-shaped wall portion extending upward from the photosensor base portion in a vertical plane such that the T-shaped wall portion forms an oblique angle with respect to the solar panel;
    a first light sensor disposed adjacent to a stem of the T-shaped wall portion on a first side thereof; and
    a second light sensor disposed adjacent to the stem of the T-shaped wall portion on a second side thereof that is opposite the first side.

2. The solar generator of claim 1, wherein the cover defines a pair of angled sidewalls rising vertically above the solar panel, and wherein inner side surfaces of the pair of sidewalls facing the solar panel are reflective.

3. The solar generator of claim 2, wherein the inner surfaces of the pair of angled sidewalls each form an angle of 40 degrees from a vertical plane.

4. The solar generator of claim 1, wherein the motor engages the base via a gear wheel secured to the motor and the gear wheel engages a track defined in the base.

5. The solar generator of claim 1, wherein the rotary plate is rotationally secured to the base via a slip ring, the slip ring configured to pass electrical power though the rotary plate while allowing the rotary plate to rotate through an unlimited number of complete revolutions.

6. The solar generator of claim 1, wherein the solar panel forms an angle of twelve degrees with respect to the horizontal plane.

7. The solar generator of claim 1, wherein the cover defines at least one hole through the cover that is located below the solar panel such that a conduit from the solar panel can pass through the cover and such that a human can access electrical components disposed on the rotary plate.

8. The solar generator of claim 1, further comprising a motor controller disposed on the rotary plate and a power source disposed on the rotary plate, the motor controller coupled to the motor, to the photosensor and to the power source.

9. The solar generator of claim 8, wherein the motor controller is configured to automatically rotate the solar panel via actuation of the motor such that the solar panel is optimally aligned with the sun as the sun moves across the sky.

10. The solar generator of claim 9, wherein the motor controller is configured to compare a solar radiation value from the first light sensor with a solar radiation value from the second light sensor and rotate the solar panel so that the solar radiation values of the first and second light sensors differ by less than a preset deviation amount.

11. The solar generator of claim 9, wherein the motor controller is configured to automatically not rotate the solar panel when a power reading provided to the motor controller is below a preset value and to automatically begin rotating the rotary plate to optimally align the solar panel with the sun when the power reading provided to the motor controller is above the preset value.

12. The solar generator of claim 1, further comprising a photosensor cover disposed over the photosensor base portion to enclose the T-shaped wall portion, the first light sensor and the second light sensor.

13. The solar generator of claim 12, wherein the photosensor further comprises a third light sensor disposed adjacent to a head of the T-shaped wall portion on a side thereof that is opposite a stem of the T-shaped wall portion.

14. A solar generator, comprising:
a base;
a rotary plate provided to the base such that the rotary plate can rotate with respect to the base;
a solar panel coupled to the rotary plate such that the solar panel rotates as the rotary plate rotates, wherein the solar panel forms a fixed oblique angle with respect to an axis of rotation of the rotary plate;
a motor provided to the rotary plate such that the motor can engage the base to enable rotation of the rotary plate with respect to the base; and
a photosensor coupled to the rotary plate such that the photosensor rotates with the rotary plate, wherein the photosensor comprises a T-shaped wall portion extending vertically upward from the rotary plate such that the T-shaped wall portion is aligned parallel to the axis of rotation of the rotary plate.

15. The solar generator of claim 14, wherein the photosensor further comprises:
a first light sensor disposed adjacent to a stem of the T-shaped wall portion on a first side thereof;
a second light sensor disposed adjacent to the stem of the T-shaped wall portion on a second side thereof that is opposite the first side; and
a cover enclosing the T-shaped wall portion, first light sensor and the second light sensor.

16. The solar generator of claim 15, wherein the photosensor further comprises a third light sensor disposed adjacent to a head of the T-shaped wall portion on a side thereof that is opposite a stem of the T-shaped wall portion.

17. A solar generator, comprising:
a base;
a rotary plate provided to the base such that the rotary plate can rotate with respect to the base;
a solar panel disposed atop the rotary plate such that the solar panel rotates with the rotary plate;
a photosensor disposed atop the rotary plate such that the photosensor rotates with the rotary plate, wherein the photosensor comprises a T-shaped wall portion extending vertically upward from the rotary plate such that the T-shaped wall defines an oblique angle with respect to the solar panel; and
a motor provided to the rotary plate such that the motor can engage the base to enable rotation of the rotary plate with respect to the base.

18. The solar generator of claim 17, wherein the photosensor further comprises:
a first light sensor disposed adjacent to a stem of the T-shaped wall portion on a first side thereof;
a second light sensor disposed adjacent to the stem of the T-shaped wall portion on a second side thereof that is opposite the first side; and
a cover enclosing the T-shaped wall portion, the first light sensor and the second light sensor.

19. The solar generator of claim 18, wherein the photosensor further comprises a third light sensor disposed adjacent to a head of the T-shaped wall portion on a side thereof that is opposite a stem of the T-shaped wall portion.

* * * * *